United States Patent
Kurii et al.

(10) Patent No.: US 9,441,303 B2
(45) Date of Patent: Sep. 13, 2016

(54) MICROETCHING SOLUTION FOR COPPER, REPLENISHMENT SOLUTION THEREFOR AND METHOD FOR PRODUCTION OF WIRING BOARD

(71) Applicant: MEC COMPANY LTD., Hyogo (JP)

(72) Inventors: Masayo Kurii, Hyogo (JP); Kiyoto Tai, Hyogo (JP); Mami Nakamura, Hyogo (JP)

(73) Assignee: MEC COMPANY LTD., Hyogo (JP)

(*) Notice: Subject to any disclaimer, the term of this patent is extended or adjusted under 35 U.S.C. 154(b) by 277 days.

(21) Appl. No.: 14/110,535

(22) PCT Filed: Mar. 4, 2013

(86) PCT No.: PCT/JP2013/055843
§ 371 (c)(1),
(2) Date: Oct. 8, 2013

(87) PCT Pub. No.: WO2014/017115
PCT Pub. Date: Jan. 30, 2014

(65) Prior Publication Data
US 2015/0115196 A1    Apr. 30, 2015

(30) Foreign Application Priority Data
Jul. 24, 2012  (JP) .................. 2012-164006

(51) Int. Cl.
| | |
|---|---|
| C09G 1/04 | (2006.01) |
| C09K 13/00 | (2006.01) |
| C23F 1/18 | (2006.01) |
| H05K 3/38 | (2006.01) |
| H05K 3/02 | (2006.01) |
| C23F 1/34 | (2006.01) |

(52) U.S. Cl.
CPC . *C23F 1/18* (2013.01); *C23F 1/34* (2013.01); *H05K 3/022* (2013.01); *H05K 3/383* (2013.01); *H05K 2203/0307* (2013.01); *H05K 2203/0789* (2013.01)

(58) Field of Classification Search
None
See application file for complete search history.

(56) References Cited

U.S. PATENT DOCUMENTS

| | | | | |
|---|---|---|---|---|
| 4,790,912 A | * | 12/1988 | Holtzman ................ | C25D 5/54 106/1.11 |
| 5,807,493 A | | 9/1998 | Maki et al. | |
| 5,883,158 A | | 3/1999 | Nambu et al. | |
| 5,965,036 A | | 10/1999 | Maki et al. | |
| 6,086,779 A | * | 7/2000 | Bishop ................ | C23F 1/18 216/105 |
| 6,426,020 B1 | | 7/2002 | Okada et al. | |
| 6,506,314 B1 | * | 1/2003 | Whitney, Jr. ........... | C23C 28/00 216/100 |
| 7,456,114 B2 | * | 11/2008 | Feng ................ | C23F 1/18 216/105 |
| 2007/0051917 A1 | * | 3/2007 | Thomas ................ | C09G 1/02 252/79.1 |
| 2010/0288731 A1 | * | 11/2010 | Wunderlich .......... | C23F 1/18 216/106 |

FOREIGN PATENT DOCUMENTS

| | | |
|---|---|---|
| DE | 697 15 804 T | 1/1997 |
| DE | 69715804 D | 5/2003 |
| EP | 0 855 454 | 7/1998 |
| HK | 1027134 | 10/2000 |
| JP | 8-53550 | 2/1996 |
| JP | 0 757 118 | 2/1997 |
| JP | 9-41162 | 2/1997 |
| JP | 9-41163 | 2/1997 |
| JP | 2000-336491 | 12/2000 |
| JP | 2006-111953 | 4/2006 |

OTHER PUBLICATIONS

International Search Report issued Jun. 4, 2013 in International (PCT) Application No. PCT/JP2013/055843.
Written Opinion of the International Searching Authority issued Jun. 4, 2013 in International (PCT) Application No. PCT/JP2013/055843.

* cited by examiner

*Primary Examiner* — Shamim Ahmed
(74) *Attorney, Agent, or Firm* — Wenderoth, Lind & Ponack, L.L.P.

(57) ABSTRACT

Disclosed is a microetching solution for copper, a replenishment solution therefor and a method for production of a wiring board. The microetching solution of the present invention consists of an aqueous solution containing a cupric ion, an organic acid, a halide ion, an amino group-containing compound having a molecular weight of 17 to 400 and a polymer. The polymer is a water-soluble polymer including a polyamine chain and/or a cationic group and having a weight average molecular weight of 1000 or more. When a concentration of the amino group-containing compound is A % by weight and a concentration of the polymer is B % by weight, a value of A/B of the microetching solution of the present invention is 50 to 6000. According to the present invention, an adhesion between copper and a resin or the like may be maintained even with a low etching amount.

11 Claims, 9 Drawing Sheets

MICROETCHING SOLUTION FOR COPPER, REPLENISHMENT SOLUTION THEREFOR AND METHOD FOR PRODUCTION OF WIRING BOARD

TECHNICAL FIELD

The invention relates to a microetching solution for copper, a replenishment solution therefor and a method for production of a wiring board.

BACKGROUND ART

In production of printed wiring boards, copper surface is roughened for improving adhesion when the copper surface is coated with an etching resist, a solder resist or the like. As a method for roughening, a method of roughening the copper surface with a microetching solution containing a specific polymer compound as described in Patent Document 1 or a microetching solution containing a specific organic acid as described in Patent Document 2 is conventionally known. According to the above-mentioned roughening method, adhesion to a solder resist and the like can be improved because deep irregularities are formed on the copper surface.

PRIOR ART DOCUMENTS

Patent Documents

Patent Document 1: Japanese Patent Laid-open Publication No. 9-41162
Patent Document 2: Japanese Patent Laid-open Publication No. 9-41163

SUMMARY OF THE INVENTION

Problems to be Solved by the Invention

In recent years, pitch narrowing (wiring miniaturization) of copper wiring of printed wiring boards has rapidly progressed, and when the copper wiring surface is roughened with a microetching solution for the purpose of improving adhesion to a solder resist and the like, problems such as an increase in resistance and breakage due to a decrease in width of copper wiring may occur depending on the etching amount. Therefore, it is required to develop a microetching solution which can maintain adhesion to a solder resist and the like even with a low etching amount. The "etching amount" refers to an average etching amount (dissolved amount) in the depth direction, and is calculated from a weight and a specific gravity of copper dissolved by a microetching solution, and a front projection area of the copper surface. The same is true for the "etching amount" below.

The microetching solutions described in Patent Document 1 and Patent Document 2 improve adhesion by forming deep irregularities on the copper surface. Therefore, a certain etching amount (e.g. 1.5 μm or more) is required for maintaining adhesion to a resin of a solder resist or the like. Accordingly, it may be difficult to suppress an increase in resistance of copper wiring in a printed wiring board requiring fine wiring.

The present invention has been devised in view of problems associated with conventional techniques as described above, and provides a microetching solution which can maintain adhesion between copper and a resin or the like even with a low etching amount, a replenishment solution added to the microetching solution, and a method for production of a wiring board using the microetching solution.

Means for Solving the Problem

A microetching solution for copper of the present invention consists of an aqueous solution containing a cupric ion, an organic acid, a halide ion, an amino group-containing compound having a molecular weight of 17 to 400 and a polymer. The polymer is a water-soluble polymer including a polyamine chain and/or a cationic group and having a weight average molecular weight of 1000 or more. When the concentration of the amino group-containing compound is A % by weight and the concentration of the polymer is B % by weight, the value of A/B of the microetching solution of the present invention is 50 to 6000.

The method for production of a wiring board of the present invention is a method for production of a wiring board which includes a copper layer, the method including a roughening treatment step of bringing the microetching solution into contact with the surface of the copper layer to roughen the surface.

The replenishment solution of the present invention is a replenishment solution which is added to the microetching solution in the method for production of a wiring board of the present invention, the replenishment solution consisting of an aqueous solution containing an organic acid, a halide ion, an amino group-containing compound having a molecular weight of 17 to 400 and a polymer. The polymer is a water-soluble polymer including a polyamine chain and/or a cationic group and having a weight average molecular weight of 1000 or more.

The "copper" in the present invention may consist of copper, or may consist of a copper alloy. The "copper" herein refers to copper or a copper alloy. The "copper layer" in the present invention also includes a copper wiring pattern layer.

Effects of the Invention

According to the present invention, adhesion between copper and a resin or the like can be maintained even with a low etching amount because unique fine irregularities can be formed on the surface of a copper layer. Accordingly, when the microetching solution is applied to, for example, a pretreatment for step of coating with a solder resist a printed wiring board requiring fine wiring, an increase in resistance and breakage of copper wiring can be suppressed.

MODE FOR CARRYING OUT THE INVENTION

<Microetching Solution>

Figure 1:
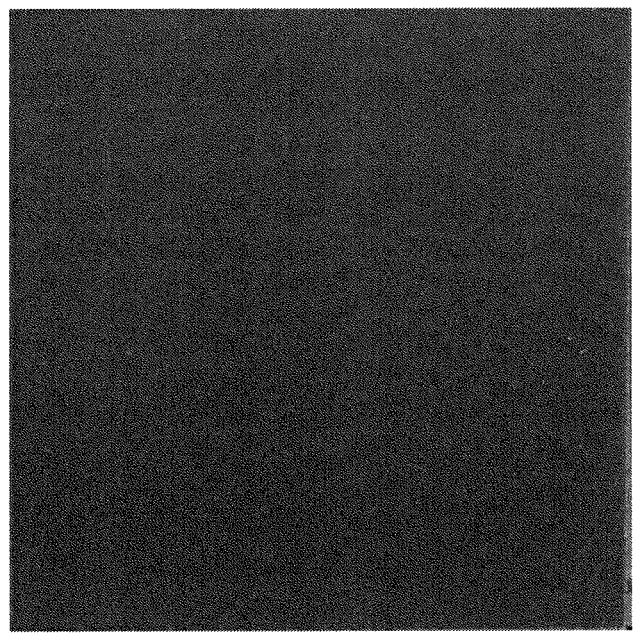
FIG. 1 A surface photograph of a test piece evaluated as rate "3" in the soldering heat resistance test.

A microetching solution for copper of the present invention is an aqueous solution containing a cupric ion, an organic acid, a halide ion, an amino group-containing compound having a molecular weight of 17 to 400 (hereinafter, also referred to simply as an "amino group-containing compound") and a polymer. Components contained in the microetching solution for copper of the present invention will be described below.

(Cupric Ion)

The cupric ion acts as an oxidant for oxidizing copper, and can be included in a microetching solution by blending a cupric ion source. Examples of the cupric ion source include copper salts of organic acids, cupric chloride, cupric bromide, cupric hydroxide and cupric oxide. The organic acid to form the copper salt is not particularly limited, but the later-described organic acid having a pKa of 5 or less is preferred for properly maintaining an etching rate. The aforementioned cupric ion sources may be used in combination of two or more thereof.

The concentration of the cupric ion is preferably 0.01 to 20% by weight, more preferably 0.1 to 10% by weight for properly maintaining an etching rate.

(Organic Acid)

The organic acid has a function of dissolving copper oxidized by a cupric ion, as well as a function of adjusting pH. It is preferred to use an organic acid having a pKa of 5 or less from the viewpoint of solubility of oxidized copper. Examples of the organic acid having a pKa of 5 or less include: saturated fatty acids such as formic acid, acetic acid, propionic acid, butyric acid, valeric acid and caproic acid; unsaturated fatty acids such as acrylic acid, crotonic acid and isocrotonic acid; aliphatic saturated dicarboxylic acids such as oxalic acid, malonic acid, succinic acid, glutaric acid, adipic acid and pimelic acid; aliphatic unsaturated dicarboxylic acids such as maleic acid; aromatic carboxylic acids such as benzoic acid, phthalic acid and cinnamic acid; carboxylic acids having a substituent, such as oxycarboxylic acids such as glycolic acid, lactic acid, malic acid, and citric acid, sulfamic acid, β-chloropropionic acid, nicotinic acid, ascorbic acid, hydroxypivalic acid and levulinic acid; and derivatives thereof. The aforementioned organic acids may be used in combination of two or more thereof.

The concentration of the organic acid in the microetching solution is preferably 0.1 to 30% by weight, more preferably 0.5 to 25% by weight from the viewpoint of solubility of oxidized copper.

(Halide Ion)

The halide ion has a function of aiding dissolution of copper to form a copper layer surface excellent in adhesion. The halide ion can be included in a microetching solution by blending a halide ion source. Examples of the halide ion source may be ion sources of a chloride ion, a bromide ion and the like. Specific examples thereof include hydrochloric acid, hydrobromic acid, sodium chloride, calcium chloride, potassium chloride, ammonium chloride, potassium bromide, sodium bromide, copper chloride, copper bromide, zinc chloride, iron chloride and tin bromide. Examples of the halide ion source include, in addition the above-mentioned compounds, compounds capable of dissociating a halide ion in a solution. The aforementioned halide ion sources may be used in combination of two or more thereof. Particularly, it is preferred to compound a chloride ion source for forming a copper layer surface excellent in adhesion. For example, cupric chloride can be used as a compound having both effects of a halide ion source and a cupric ion source.

The concentration of the halide ion in the microetching solution is preferably 0.01 to 20% by weight, more preferably 0.1 to 20% by weight for forming a copper layer surface excellent in adhesion.

(Amino Group-Containing Compound)

The amino group-containing compound is blended in the microetching solution together with the later-described polymer for forming fine irregularities on the copper layer surface. The amino group-containing compound is not particularly limited as long as it has a molecular weight of 17 to 400 and includes an amino group, but a compound having a molecular weight of 17 to 250 and including an amino group is preferred from the viewpoint of solubility. The "amino group" refers to any of —$NH_2$, —NHR and —NRR', where the R and R' each independently represent a hydrocarbon group that may have a substituent. The amino group-containing compound for use in the present invention is a compound different from the above-described organic acids and different from low-molecular-weight components of the later-described polymers.

Specific examples of the amino group-containing compound includes ammonia, ammonium ion, methylamine, dimethylamine, trimethylamine, ethylamine, diethylamine, triethylamine, ethylenediamine, aniline, monoethanolamine, diethanolamine, triethanolamine, N-methyldiethanolamine and the like. An ion such as an ammonium ion can be included in a microetching solution by blending an ion source thereof. The amino group-containing compounds may be used in combination of two or more thereof. Particularly, one or more selected from ammonia, ammonium ion and ethylenediamine is/are preferred for forming fine irregularities on the copper layer surface. For example, ammonium chloride can be used as a compound having both effects of a halide ion source and an ammonium ion source.

The concentration of the amino group-containing compound in the microetching solution is preferably 0.005 to 20% by weight, more preferably 0.1 to 10% by weight for forming fine irregularities on the copper layer surface.

(Polymer)

The polymer for use in the present invention is a water-soluble polymer including a polyamine chain and/or a cationic group and having a weight average molecular weight of 1000 or more. The polymer is blended in the microetching solution together with the above-described amino group-containing compound for forming fine irregularities on the copper layer surface. A polymer having a weight average molecular weight of 1000 to 5000000 is preferable from the viewpoint of water solubility. The "weight average molecular weight" is a value obtained in terms of polyethylene glycol by gel permeation chromatography.

Specific examples of the polymer include quaternary ammonium salt-type polymers such as a quaternary ammonium salt-type styrene polymer, a quaternary ammonium salt-type aminoalkyl (meth)acrylate polymer, a quaternary ammonium salt-type diallylamine polymer and a quaternary ammonium salt-type diallylamine-acrylamide copolymer, polyethyleneimine, polyalkylene polyamine polymers of a salt of aminoalkyl acrylamide, and cationic cellulose derivatives. Examples of the aforementioned salt include hydrochloric acid salts. The aforementioned polymers may be used in combination of two or more thereof. Particularly, one or more selected from quaternary ammonium salt-type polymers, polyethyleneimine and polyalkylene polyamine is/are preferred for forming fine irregularities on the copper layer surface. As the polymer, those that are commercially available as antistatic agents for resins and fibers, polymer coagulants for wastewater treatment, conditioning components of hair conditioners and so on may be used.

The concentration of the polymer in the microetching solution is preferably 0.0001 to 0.01% by weight, more preferably 0.0002 to 0.005% by weight for forming fine irregularities on the copper layer surface.

In the present invention, where the concentration of the amino group-containing compound is A % by weight and the concentration of the polymer is B % by weight, the former and latter components are blended so that the value of A/B is 50 to 6000. In this way, unique fine irregularities suitable for adhesion to a resin are formed on the copper layer surface, and therefore adhesion between copper and the resin can be maintained even with a low etching amount. Accordingly, when the microetching solution of the present invention is applied to, for example, a pretreatment for step of coating with a solder resist a printed wiring board requiring fine wiring, an increase in resistance of copper wiring can be suppressed because the width of copper wiring can be easily maintained. Further, since the etching amount can be reduced, replacement frequency of the microetching solution can be reduced. Consequently, reduction of running costs is easy. The value of A/B is preferably 100 to 6000, more preferably 300 to 6000 for forming, on the copper layer surface, fine irregularities suitable for adhesion to a resin.

In the present invention, where the concentration of the halide ion is C % by weight and the concentration of the polymer is B % by weight, the value of C/B is preferably 1500 to 15000, more preferably 1600 to 15000, further preferably 1800 to 15000. When the value of C/B is in the aforementioned range, fine irregularities suitable for adhesion to a resin are easily formed on the copper layer surface. Where the concentration of the cupric ion is D % by weight and the concentration of the polymer is B % by weight, the value of D/B is preferably 1500 to 10000, more preferably 1500 to 9500, further preferably 1500 to 9000 from the same viewpoint as above.

(Other Additives)

The microetching solution of the present invention may contain components other than those described above. For example, a nonionic surfactant may be added as an anti-foaming agent to the microetching solution of the present invention. Nonionic surfactants that can be used in the present invention are those having no polyamine chain. A salt such as a sodium salt or potassium salt of an organic acid may be added for reducing variations of pH during roughening treatment, and a complexing agent such as pyridine may be added for improving dissolving stability of copper. In addition, various additives may be added as required. When these additives are added, the concentration of the additives in the microetching solution is about 0.0001 to 20% by weight.

The microetching solution of the present invention can be easily prepared by dissolving the aforementioned components in ion-exchanged water or the like.

<Method for Production of Wiring Board>

A method for production of a wiring board in the present invention is a method for production of a wiring board including a copper layer. The method includes roughening treatment step of bringing the above-described microetching solution of the present invention into contact with the surface of the copper layer to roughen the surface. When a wiring board including a plurality of copper layers is produced, only one of the plurality of copper layers may be treated with the microetching solution of the present invention, or two or more copper layers may be treated with the microetching solution of the present invention.

The roughening treatment step is not particularly limited, and examples thereof include a method in which a microetching solution is sprayed to the surface of a copper layer to be treated and a method in which a copper layer to be treated is dipped in a microetching solution. When the microetching solution is sprayed, it is preferred to perform etching at a microetching solution temperature of 10 to 40° C. and a spray pressure of 0.03 to 0.3 MPa for 5 to 120 seconds. When the copper layer is dipped, it is preferred to perform etching at a microetching solution temperature of 10 to 40° C. for 5 to 120 seconds. Furthermore, when the copper layer is dipped in a microetching solution, it is preferred to blow air into the microetching solution by bubbling or the like so that a cuprous ion generated in the microetching solution by etching of copper is oxidized to a cupric ion. An effluent disposal for the microetching solution of the present invention after use is easy. The disposal treatment can be performed by a general simple method using, for example, a neutralizer, a polymer coagulant or the like.

In the present invention, the $L^*$ value of the surface of the copper layer after being brought into contact with the microetching solution is preferably 70 or less, more preferably 40 to 70. The $L^*$ value is a brightness $L^*$ in the $L^*a^*b^*$ color system (JIS Z 8729), and is measured by the method described in Example described later. The irregularities of the copper layer surface tend to become finer as the $L^*$ value decreases. When fine irregularities suitable for adhesion to a resin are formed on the copper layer surface, the $L^*$ value tends to fall within the aforementioned range.

The $L^*$ value of the surface of the copper layer can be controlled to fall within the above-described range by adjusting the compounding ratio of the microetching solution or adjusting the etching amount. That is, in one embodiment of the present invention, the compounding ratio of the microetching solution can be adjusted or the etching amount (etching time) can be adjusted so that the $L^*$ value of the copper layer surface falls within the aforementioned range. For example, in the production method of the present invention, after the copper layer surface is subjected to a roughening treatment with a microetching solution, the amount of the later-described replenishment solution to be added and timing of adding the replenishment solution can be controlled while the $L^*$ value of the copper layer surface after the roughening treatment is monitored. The $L^*$ value is one of indices for evaluating the shape of irregularities of the copper layer surface, and does not necessarily correspond one-to-one with the shape or size of the irregularities of the copper layer surface. Therefore, an $L^*$ value of the copper layer surface, which is most suitable for adhesion to a resin or the like, may vary depending on the composition of the microetching solution, and the like.

In the present invention, the etching amount in roughening the surface of the copper layer is preferably 0.05 µm or more, more preferably 0.15 µm or more for improving adhesion to a resin. The etching amount is preferably 1.0 µm or less, more preferably 0.7 µm or less for suppressing an increase in resistance and breakage of wiring by reducing the etching amount in a pretreatment for step of coating with a solder resist a printed wiring board requiring fine wiring, or the like. Putting this together, the etching amount in roughening the surface of the copper layer is preferably 0.05 to 1.0 µm, more preferably 0.15 to 0.7 p.m.

In the present invention, it is preferred to wash the roughened copper layer surface with an acidic aqueous solution for removing generated smut after the roughening treatment step. As the acidic aqueous solution to be used for washing, hydrochloric acid, an aqueous sulfuric solution, a nitric acid aqueous solution and the like can be used, but hydrochloric acid is preferred because it has less influence on a roughened shape and has high smut removing performance. From the viewpoint of smut removing performance, the acid concentration of the acidic aqueous solution is preferably 0.3 to 35% by weight, more preferably 1 to 10% by weight. The washing method is not particularly limited, and examples thereof include a method in which an acidic aqueous solution is sprayed to a roughened copper layer surface and a method in which a roughened copper layer surface is dipped in an acidic aqueous solution. When the acidic aqueous solution is sprayed, it is preferred to perform washing at an acidic aqueous solution temperature of 15 to 35° C. and a spray pressure of 0.03 to 0.3 MPa for 3 to 30 seconds. When the copper layer is dipped, it is preferred to perform washing at an acidic aqueous solution temperature of 15 to 35° C. for 3 to 30 seconds.

The roughening treatment step is preferably step of roughening the surface of the copper layer while adding a replenishment solution to the microetching solution, wherein the replenishment solution consists of an aqueous solution containing an organic acid, a halide ion, an amino group-containing compound having a molecular weight of 17 to 400 and a polymer. Accordingly, the concentrations of the components in the microetching solution during treatment can be properly maintained. Timing of adding the replenishment solution may be appropriately set according to the concentration control range of each component or the like. The components in the replenishment solution are similar to the components contained in the microetching solution of the present invention described above.

The concentrations of the components in the replenishment solution are appropriately adjusted according to the initial concentration of a microetching solution to be used for treatment, or the like, and for example, if the concentration of the organic acid is 0.5 to 30% by weight, the concentration of the halide ion is 0.1 to 20% by weight, the concentration of the amino group-containing compound having a molecular weight of 17 to 400 is 0.05 to 20% by weight and the concentration of the polymer is 0.0001 to 0.02% by weight, the concentrations of the components in the microetching solution during treatment can be easily maintained.

The replenishment solution can be easily prepared by dissolving the aforementioned components in ion-exchanged water or the like.

After the treatment with the microetching solution of the present invention, a treatment with an aqueous solution of azoles or an alcohol solution may be performed as disclosed in, for example, U.S. Pat. No. 3,645,772 in order to further improve adhesion to a resin. Further, after the treatment with the microetching solution of the present invention, an oxidation treatment called a brown oxide treatment or a black oxide treatment may be performed.

The microetching solution of the present invention can be widely used for roughening a copper layer surface, and so on. Particularly, unique fine irregularities suitable for adhesion to a resin are formed on the surface of a copper layer treated, leading to satisfactory adhesion to resins of a prepreg, a solder resist, a dry film resist, an electrodeposition resist and the like. The microetching solution also provides a surface excellent in solderability, and is therefore particularly useful for production of various printed wiring boards including those for pin grid array (PGA) and those for ball grid array (BGA). It is also useful for surface treatment of a lead frame. Particularly, when the microetching solution is applied to a pretreatment for step of coating with a solder resist a printed wiring board requiring fine wiring, an increase in resistance of copper wiring can be suppressed because the etching amount can be reduced.

EXAMPLES

Examples of the present invention are described along with Comparative Examples. The present invention should not be construed to be limited to Examples below.

<Treatment with Microetching Solution>

An epoxy resin-impregnated glass fabric copper-clad laminated (manufactured by Hitachi Chemical Company, Ltd., trade name: MCL-E-67, 10 cm×10 cm, thickness 0.2 mm) with copper foils having a thickness of 35 μm laminated to both surfaces of an insulating substrate was provided as a test board. Next, one surface of the test board was sprayed at a spray pressure of 0.05 MPa with each of microetching solutions (25° C.) shown in Tables 1-1 to 1-5, and etching was performed with the etching time adjusted so as to have an etching amount of 0.5 μm at the one surface of the test board. Then, the test board was washed with water, and the etching-treated surface was dipped in hydrochloric acid at a temperature of 25° C. (hydrogen chloride concentration: 3.5% by weight) for 10 seconds, and then washed with water and dried. The remainder of the components of each of the microetching solutions shown in Tables 1-1 to 1-5 is ion-exchanged water.

It should be noted that the microetching solution of Comparative Example 1 shown in Table 1-1 is identical in composition to the microetching solution of Example 1 in Patent Document 1 (JP A 9-41162) described above. "EPOMIN P-1000" used here is an aqueous solution having a polymer content of 30% by weight, and therefore the microetching solution of Example 1 in Patent Document 1 (Comparative Example 1 shown in Table 1-1 below) has a polymer concentration (B) of 0.00015% by weight.

<Evaluation of Adhesion by Soldering Heat Resistance Test>

Figure 2:
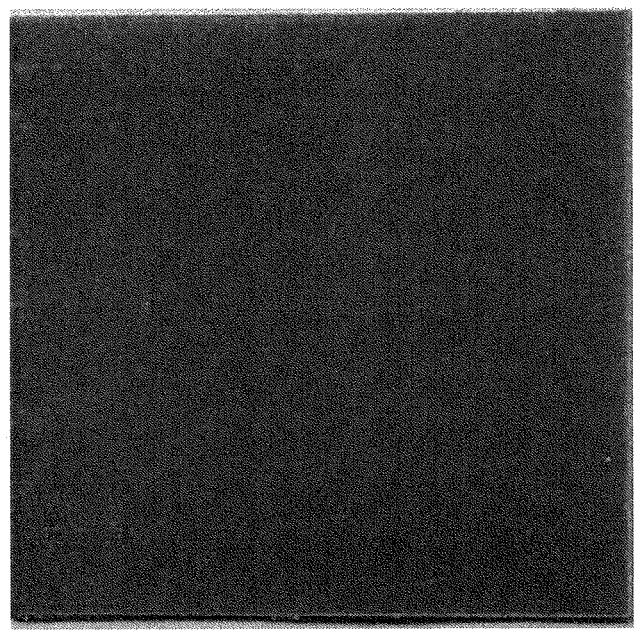
FIG. 2 A surface photograph of a test piece evaluated as rate "2" in the soldering heat resistance test.
Figure 3:
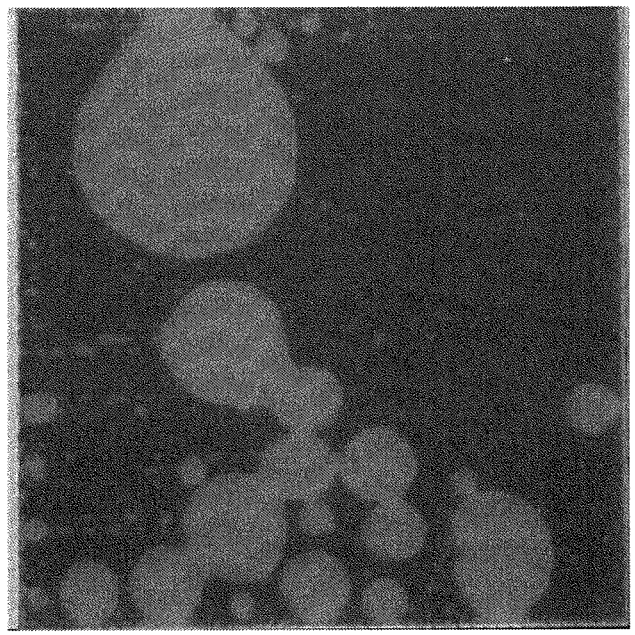
FIG. 3 A surface photograph of a test piece evaluated as rate "1" in the soldering heat resistance test.

An epoxy resin-impregnated glass fabric prepreg (manufactured by Hitachi Chemical Company, Ltd., trade name: GEA-67N, thickness 0.1 mm) was laminated to the etching-treated surface of the test board after drying by laminating press (press pressure: 30 MPa, temperature: 170° C., time: 60 minutes). Then, the peripheral part of the laminated board was cut off to prepare a test piece. The test piece was left standing at 120° C. (relative humidity: 100%) for 2 hours, and then dipped in a molten solder bath at 220° C. for 30 seconds in accordance with JIS C 6481. The test pieces after dipping were visually observed, and evaluations were performed as follows: those having no blister were rated "3" (see FIG. 1); those having a blister having a maximum diameter of less than 1 mm were rated "2" (see FIG. 2); and those a blister having a maximum diameter of 1 mm or more were rated "1" (see FIG. 3). The results are shown in Tables 1-1 to 1-5. No blister is to be observed when adhesion between the copper foil and the resin is satisfactory.

<Evaluation of Roughened Surface by L* Value>

For the etching-treated surface of the test board after drying, three areas were arbitrarily selected, L* values at the areas were measured using a color-difference meter manufactured by KONICA MINOLTA, INC. (Model: CR-10), and an average value thereof was calculated. The results are shown in Tables 1-1 to 1-5.

TABLE 1-1

| | Blending components | | Amino group-containing compound (A) | | Polymer (B) | Halide ion (C) | | Cupric ion (D) |
|---|---|---|---|---|---|---|---|---|
| | Components | Concentration (% by weight) | Type | Concentration (% by weight) | Concentration (% by weight) | Type | Concentration (% by weight) | Concentration (% by weight) |
| Example 1 | Sodium chloride | 2.50 | Ammonium ion | 1.4 | 0.00045 | Chloride ion | 3.4 | 1.7 |
| | Sodium formate | 2.50 | | | | | | |
| | Ammonium acetate | 6.00 | | | | | | |
| | Formic acid | 5.00 | | | | | | |
| | Epomin P-1000*[1] | 0.00150 | | | | | | |
| | Cupric chloride dihydrate | 4.50 | | | | | | |
| Example 2 | Sodium chloride | 4.00 | Ammonium ion | 0.05 | 0.00090 | Chloride ion | 4.3 | 1.7 |
| | Sodium formate | 2.50 | | | | | | |
| | Ammonium acetate | 0.20 | | | | | | |
| | Formic acid | 5.00 | | | | | | |
| | Epomin P-1000*[1] | 0.00300 | | | | | | |
| | Cupric chloride dihydrate | 4.50 | | | | | | |
| Example 3 | Sodium chloride | 2.50 | Ethylenediamine | 1.0 | 0.00045 | Chloride ion | 3.4 | 1.7 |
| | Sodium formate | 2.50 | | | | | | |
| | Ethylenediamine | 1.00 | | | | | | |
| | Formic acid | 5.00 | | | | | | |
| | Epomin P-1000*[1] | 0.00150 | | | | | | |
| | Cupric chloride dihydrate | 4.50 | | | | | | |
| Comparative Example 1 | Ammonium chloride | 4.00 | Ammonium ion | 1.3 | 0.00015 | Chloride ion | 2.7 | 1.8 |
| | Acetic acid | 7.00 | | | | | | |
| | Epomin P-1000*[1] | 0.00050 | | | | | | |
| | Cupric acetate | 5.00 | | | | | | |
| Comparative Example 2 | Ammonium chloride | 8.00 | Ammonium ion | 2.7 | 0.00015 | Chloride ion | 5.3 | 2.1 |
| | Formic acid | 2.00 | | | | | | |
| | Epomin P-1000*[1] | 0.00050 | | | | | | |
| | Cupric formate | 5.00 | | | | | | |
| Comparative Example 3 | Sodium chloride | 4.00 | Ethylenediamine | 1.0 | 0.00015 | Chloride ion | 2.4 | 1.8 |
| | Acrylic acid | 20.00 | | | | | | |
| | Epomin P-1000*[1] | 0.00050 | | | | | | |
| | Cupric acetate | 5.00 | | | | | | |
| | Ethylenediamine | 1.00 | | | | | | |

TABLE 1-1-continued

| | | Blending components | | Concentration ratio | | | Soldering heat resistance | L* value |
|---|---|---|---|---|---|---|---|---|
| | | Components | Concentration (% by weight) | A/B | C/B | D/B | | |
| Example 1 | | Sodium chloride | 2.50 | 3107 | 7527 | 3720 | 3 | 69.0 |
| | | Sodium formate | 2.50 | | | | | |
| | | Ammonium acetate | 6.00 | | | | | |
| | | Formic acid | 5.00 | | | | | |
| | | Epomin P-1000*[1] | 0.00150 | | | | | |
| | | Cupric chloride dihydrate | 4.50 | | | | | |
| Example 2 | | Sodium chloride | 4.00 | 52 | 4773 | 1860 | 3 | 70.0 |
| | | Sodium formate | 2.50 | | | | | |
| | | Ammonium acetate | 0.20 | | | | | |
| | | Formic acid | 5.00 | | | | | |
| | | Epomin P-1000*[1] | 0.00300 | | | | | |
| | | Cupric chloride dihydrate | 4.50 | | | | | |
| Example 3 | | Sodium chloride | 2.50 | 2222 | 7527 | 3720 | 3 | 69.3 |
| | | Sodium formate | 2.50 | | | | | |
| | | Ethylenediamine | 1.00 | | | | | |
| | | Formic acid | 5.00 | | | | | |
| | | Epomin P-1000*[1] | 0.00150 | | | | | |
| | | Cupric chloride dihydrate | 4.50 | | | | | |
| Comparative Example 1 | | Ammonium chloride | 4.00 | 8960 | 17707 | 11667 | 1 | 70.1 |
| | | Acetic acid | 7.00 | | | | | |
| | | Epomin P-1000*[1] | 0.00050 | | | | | |
| | | Cupric acetate | 5.00 | | | | | |
| Comparative Example 2 | | Ammonium chloride | 8.00 | 17920 | 35413 | 13800 | 1 | 76.0 |
| | | Formic acid | 2.00 | | | | | |
| | | Epomin P-1000*[1] | 0.00050 | | | | | |
| | | Cupric formate | 5.00 | | | | | |
| Comparative Example 3 | | Sodium chloride | 4.00 | 6667 | 16160 | 11667 | 1 | 77.1 |
| | | Acrylic acid | 20.00 | | | | | |
| | | Epomin P-1000*[1] | 0.00050 | | | | | |
| | | Cupric acetate | 5.00 | | | | | |
| | | Ethylenediamine | 1.00 | | | | | |

*[1] manufactured by Nippon Shokubai Co., Ltd., 30 wt % aqueous solution of polyethyleneimine, weight average molecular weight of polymer: 70000

TABLE 1-2

| | Blending components | | Amino group-containing compound (A) | | Polymer (B) | Halide ion (C) | | Cupric ion (D) |
|---|---|---|---|---|---|---|---|---|
| | Components | Concentration (% by weight) | Type | Concentration (% by weight) | Concentration (% by weight) | Type | Concentration (% by weight) | Concentration (% by weight) |
| Example 4 | Sodium bromide | 2.50 | Ammonium ion | 1.4 | 0.00045 | Bromide ion | 5.2 | 1.3 |
| | Sodium formate | 2.50 | | | | | | |
| | Ammonium acetate | 6.00 | | | | | | |
| | Formic acid | 5.00 | | | | | | |
| | Epomin P-1000*[1] | 0.00150 | | | | | | |
| | Cupric bromide | 4.50 | | | | | | |
| Example 5 | Sodium chloride | 2.50 | Ammonium ion | 1.4 | 0.00045 | Chloride ion | 3.4 | 1.7 |
| | Sodium acetate | 2.50 | | | | | | |
| | Ammonium acetate | 6.00 | | | | | | |
| | Acetic acid | 5.00 | | | | | | |
| | Epomin P-1000*[1] | 0.00150 | | | | | | |
| | Cupric chloride dihydrate | 4.50 | | | | | | |
| Comparative Example 4 | Sodium chloride | 5.00 | Ammonium ion | 0.02 | 0.00120 | Chloride ion | 5.9 | 2.6 |
| | Sodium formate | 2.50 | | | | | | |
| | Ammonium acetate | 0.10 | | | | | | |
| | Formic acid | 5.00 | | | | | | |
| | Epomin P-1000*[1] | 0.00400 | | | | | | |
| | Cupric chloride dihydrate | 7.00 | | | | | | |
| Comparative Example 5 | Sodium chloride | 5.00 | Ammonium ion | 2.8 | 0.00042 | Chloride ion | 5.9 | 2.6 |
| | Sodium formate | 2.50 | | | | | | |
| | Ammonium acetate | 12.00 | | | | | | |
| | Formic acid | 5.00 | | | | | | |
| | Epomin P-1000*[1] | 0.00140 | | | | | | |
| | Cupric chloride dihydrate | 7.00 | | | | | | |
| Comparative Example 6 | Sodium chloride | 5.00 | Ammonium ion | 0.02 | 0.00069 | Chloride ion | 5.9 | 2.6 |
| | Sodium formate | 2.50 | | | | | | |
| | Ammonium acetate | 0.10 | | | | | | |
| | Formic acid | 5.00 | | | | | | |
| | Epomin P-1000*[1] | 0.00230 | | | | | | |
| | Cupric chloride dihydrate | 7.00 | | | | | | |

TABLE 1-2-continued

| | Blending components | | | | | | | | |
|---|---|---|---|---|---|---|---|---|---|
| Comparative Example 7 | Sodium chloride | 4.00 | Ammonium ion | 0.05 | 0.00120 | Chloride ion | 4.3 | 1.7 | |
| | Sodium formate | 2.50 | | | | | | | |
| | Ammonium acetate | 0.20 | | | | | | | |
| | Formic acid | 5.00 | | | | | | | |
| | Epomin P-1000*¹ | 0.00400 | | | | | | | |
| | Cupric chloride dihydrate | 4.50 | | | | | | | |

| | | Blending components | | Concentration ratio | | | Soldering heat resistance | L* value |
|---|---|---|---|---|---|---|---|---|
| | | Components | Concentration (% by weight) | A/B | C/B | D/B | | |
| Example 4 | | Sodium bromide | 2.50 | 3107 | 11471 | 2840 | 3 | 69.8 |
| | | Sodium formate | 2.50 | | | | | |
| | | Ammonium acetate | 6.00 | | | | | |
| | | Formic acid | 5.00 | | | | | |
| | | Epomin P-1000*¹ | 0.00150 | | | | | |
| | | Cupric bromide | 4.50 | | | | | |
| Example 5 | | Sodium chloride | 2.50 | 3107 | 7527 | 3720 | 3 | 69.0 |
| | | Sodium acetate | 2.50 | | | | | |
| | | Ammonium acetate | 6.00 | | | | | |
| | | Acetic acid | 5.00 | | | | | |
| | | Epomin P-1000*¹ | 0.00150 | | | | | |
| | | Cupric chloride dihydrate | 4.50 | | | | | |
| Comparative Example 4 | | Sodium chloride | 5.00 | 19 | 4952 | 2170 | 1 | 79.1 |
| | | Sodium formate | 2.50 | | | | | |
| | | Ammonium acetate | 0.10 | | | | | |
| | | Formic acid | 5.00 | | | | | |
| | | Epomin P-1000*¹ | 0.00400 | | | | | |
| | | Cupric chloride dihydrate | 7.00 | | | | | |
| Comparative Example 5 | | Sodium chloride | 5.00 | 6657 | 14148 | 6200 | 1 | 78.2 |
| | | Sodium formate | 2.50 | | | | | |
| | | Ammonium acetate | 12.00 | | | | | |
| | | Formic acid | 5.00 | | | | | |
| | | Epomin P-1000*¹ | 0.00140 | | | | | |
| | | Cupric chloride dihydrate | 7.00 | | | | | |
| Comparative Example 6 | | Sodium chloride | 5.00 | 34 | 8612 | 3774 | 1 | 78.3 |
| | | Sodium formate | 2.50 | | | | | |
| | | Ammonium acetate | 0.10 | | | | | |
| | | Formic acid | 5.00 | | | | | |
| | | Epomin P-1000*¹ | 0.00230 | | | | | |
| | | Cupric chloride dihydrate | 7.00 | | | | | |
| Comparative Example 7 | | Sodium chloride | 4.00 | 39 | 3580 | 1395 | 1 | 75.5 |
| | | Sodium formate | 2.50 | | | | | |
| | | Ammonium acetate | 0.20 | | | | | |
| | | Formic acid | 5.00 | | | | | |
| | | Epomin P-1000*¹ | 0.00400 | | | | | |
| | | Cupric chloride dihydrate | 4.50 | | | | | |

*¹manufactured by Nippon Shokubai Co., Ltd., 30 wt % aqueous solution of polyethyleneimine, weight average molecular weight of polymer: 70000

TABLE 1-3

| | Blending components | | Amino group-containing compound (A) | | Polymer (B) | Halide ion (C) | | Cupric ion (D) |
|---|---|---|---|---|---|---|---|---|
| | Components | Concentration (% by weight) | Type | Concentration (% by weight) | Concentration (% by weight) | Type | Concentration (% by weight) | Concentration (% by weight) |
| Example 6 | Sodium chloride | 0.25 | Ammonium ion | 1.0 | 0.00094 | Chloride ion | 3.3 | 2.8 |
| | Sodium formate | 12.00 | | | | | | |
| | Ammonium acetate | 4.50 | | | | | | |
| | Formic acid | 4.50 | | | | | | |
| | Unisence FPA1001L*² | 0.00200 | | | | | | |
| | Cupric chloride dihydrate | 7.50 | | | | | | |
| Example 7 | Sodium chloride | 0.25 | Ammonium ion | 1.4 | 0.00024 | Chloride ion | 2.0 | 1.7 |
| | Sodium formate | 12.00 | | | | | | |
| | Ammonium acetate | 6.00 | | | | | | |
| | Formic acid | 4.50 | | | | | | |
| | Unisence FPA1001L*² | 0.00050 | | | | | | |
| | Cupric chloride dihydrate | 4.50 | | | | | | |
| Example 8 | Sodium chloride | 7.70 | Ammonium ion | 0.82 | 0.00059 | Chloride ion | 7.6 | 2.6 |
| | Sodium formate | 12.00 | | | | | | |
| | Ammonium acetate | 3.50 | | | | | | |
| | Formic acid | 4.50 | | | | | | |
| | Unisence FPA1001L*² | 0.00125 | | | | | | |
| | Cupric chloride dihydrate | 7.00 | | | | | | |

TABLE 1-3-continued

| | | | | | | | | | |
|---|---|---|---|---|---|---|---|---|---|
| Example 9 | Sodium chloride | 10.00 | Ammonium ion | 0.82 | 0.00059 | Chloride ion | 8.8 | | 2.4 |
| | Sodium formate | 12.00 | | | | | | | |
| | Ammonium acetate | 3.50 | | | | | | | |
| | Formic acid | 4.50 | | | | | | | |
| | Unisence FPA1001L*[2] | 0.00125 | | | | | | | |
| | Cupric chloride dihydrate | 6.50 | | | | | | | |
| Example 10 | Sodium chloride | 10.60 | Ammonium ion | 0.82 | 0.00059 | Chloride ion | 9.1 | | 2.4 |
| | Sodium formate | 12.00 | | | | | | | |
| | Ammonium acetate | 3.50 | | | | | | | |
| | Formic acid | 4.50 | | | | | | | |
| | Unisence FPA1001L*[2] | 0.00125 | | | | | | | |
| | Cupric chloride dihydrate | 6.50 | | | | | | | |

| | Blending components | | Concentration ratio | | | Soldering heat resistance | L* value |
|---|---|---|---|---|---|---|---|
| | Components | Concentration (% by weight) | A/B | C/B | D/B | | |
| Example 6 | Sodium chloride | 0.25 | 1115 | 3480 | 2968 | 3 | 60.5 |
| | Sodium formate | 12.00 | | | | | |
| | Ammonium acetate | 4.50 | | | | | |
| | Formic acid | 4.50 | | | | | |
| | Unisence FPA1001L*[2] | 0.00200 | | | | | |
| | Cupric chloride dihydrate | 7.50 | | | | | |
| Example 7 | Sodium chloride | 0.25 | 5949 | 8611 | 7123 | 3 | 68.6 |
| | Sodium formate | 12.00 | | | | | |
| | Ammonium acetate | 6.00 | | | | | |
| | Formic acid | 4.50 | | | | | |
| | Unisence FPA1001L*[2] | 0.00050 | | | | | |
| | Cupric chloride dihydrate | 4.50 | | | | | |
| Example 8 | Sodium chloride | 7.70 | 1388 | 12899 | 4432 | 3 | 67.1 |
| | Sodium formate | 12.00 | | | | | |
| | Ammonium acetate | 3.50 | | | | | |
| | Formic acid | 4.50 | | | | | |
| | Unisence FPA1001L*[2] | 0.00125 | | | | | |
| | Cupric chloride dihydrate | 7.00 | | | | | |
| Example 9 | Sodium chloride | 10.00 | 1388 | 14917 | 4116 | 3 | 62.6 |
| | Sodium formate | 12.00 | | | | | |
| | Ammonium acetate | 3.50 | | | | | |
| | Formic acid | 4.50 | | | | | |
| | Unisence FPA1001L*[2] | 0.00125 | | | | | |
| | Cupric chloride dihydrate | 6.50 | | | | | |
| Example 10 | Sodium chloride | 10.60 | 1388 | 15536 | 4116 | 2 | 65.0 |
| | Sodium formate | 12.00 | | | | | |
| | Ammonium acetate | 3.50 | | | | | |
| | Formic acid | 4.50 | | | | | |
| | Unisence FPA1001L*[2] | 0.00125 | | | | | |
| | Cupric chloride dihydrate | 6.50 | | | | | |

*[2]manufactured by Senka Corporation, 47 wt % aqueous solution of quaternary ammonium salt-type polymer, weight average molecular weight of polymer: 200000

TABLE 1-4

| | Blending components | | Amino group-containing compound (A) | | Polymer (B) | Halide ion (C) | | Cupric ion (D) |
|---|---|---|---|---|---|---|---|---|
| | Components | Concentration (% by weight) | Type | Concentration (% by weight) | Concentration (% by weight) | Type | Concentration (% by weight) | Concentration (% by weight) |
| Example 11 | Sodium chloride | 4.50 | Ammonium ion | 1.0 | 0.00188 | Chloride ion | 4.8 | 1.9 |
| | Sodium formate | 12.00 | | | | | | |
| | Ammonium acetate | 4.50 | | | | | | |
| | Formic acid | 4.50 | | | | | | |
| | Unisence FPA1001L*[2] | 0.00400 | | | | | | |
| | Cupric chloride dihydrate | 5.10 | | | | | | |
| Example 12 | Sodium chloride | 4.50 | Ammonium ion | 1.0 | 0.00188 | Chloride ion | 5.9 | 2.8 |
| | Sodium formate | 12.00 | | | | | | |
| | Ammonium acetate | 4.50 | | | | | | |
| | Formic acid | 4.50 | | | | | | |
| | Unisence FPA1001L*[2] | 0.00400 | | | | | | |
| | Cupric chloride dihydrate | 7.60 | | | | | | |
| Example 13 | Sodium chloride | 4.50 | Ammonium ion | 1.0 | 0.00141 | Chloride ion | 5.9 | 2.8 |
| | Sodium formate | 12.00 | | | | | | |
| | Ammonium acetate | 4.50 | | | | | | |
| | Formic acid | 4.50 | | | | | | |
| | Unisence FPA1001L*[2] | 0.00300 | | | | | | |
| | Cupric chloride dihydrate | 7.60 | | | | | | |

TABLE 1-4-continued

| | Blending components | | | | | | | |
|---|---|---|---|---|---|---|---|---|
| Example 14 | Ammonium chloride | 3.00 | Ammonium ion and Ammonia | 1.1 | 0.00080 | Chloride ion | 2.0 | 1.4 |
| | Ammonia | 0.10 | | | | | | |
| | Formic acid | 5.00 | | | | | | |
| | H.C. polymer 2L *³ | 0.00400 | | | | | | |
| | Cupric oxide | 1.80 | | | | | | |
| | Surfynol 440 *⁴ | 0.00100 | | | | | | |
| Example 15 | Ammonium chloride | 1.52 | Ammonium ion and Ammonia | 1.0 | 0.00100 | Chloride ion | 1.0 | 1.8 |
| | Ammonia | 0.50 | | | | | | |
| | Formic acid | 5.00 | | | | | | |
| | H.C. polymer 2L *³ | 0.00500 | | | | | | |
| | Cupric oxide | 2.20 | | | | | | |
| | Surfynol 440 *⁴ | 0.00100 | | | | | | |

| | Blending components | | Concentration ratio | | | Soldering heat resistance | L* value |
|---|---|---|---|---|---|---|---|
| | Components | Concentration (% by weight) | A/B | C/B | D/B | | |
| Example 11 | Sodium chloride | 4.50 | 558 | 2579 | 1009 | 2 | 75.0 |
| | Sodium formate | 12.00 | | | | | |
| | Ammonium acetate | 4.50 | | | | | |
| | Formic acid | 4.50 | | | | | |
| | Unisence FPA1001L*² | 0.00400 | | | | | |
| | Cupric chloride dihydrate | 5.10 | | | | | |
| Example 12 | Sodium chloride | 4.50 | 558 | 3132 | 1504 | 3 | 61.4 |
| | Sodium formate | 12.00 | | | | | |
| | Ammonium acetate | 4.50 | | | | | |
| | Formic acid | 4.50 | | | | | |
| | Unisence FPA1001L*² | 0.00400 | | | | | |
| | Cupric chloride dihydrate | 7.60 | | | | | |
| Example 13 | Sodium chloride | 4.50 | 744 | 4176 | 2005 | 3 | 59.8 |
| | Sodium formate | 12.00 | | | | | |
| | Ammonium acetate | 4.50 | | | | | |
| | Formic acid | 4.50 | | | | | |
| | Unisence FPA1001L*² | 0.00300 | | | | | |
| | Cupric chloride dihydrate | 7.60 | | | | | |
| Example 14 | Ammonium chloride | 3.00 | 1385 | 2490 | 1796 | 3 | 56.7 |
| | Ammonia | 0.10 | | | | | |
| | Formic acid | 5.00 | | | | | |
| | H.C. polymer 2L *³ | 0.00400 | | | | | |
| | Cupric oxide | 1.80 | | | | | |
| | Surfynol 440 *⁴ | 0.00100 | | | | | |
| Example 15 | Ammonium chloride | 1.52 | 1011 | 1009 | 1756 | 2 | 74.4 |
| | Ammonia | 0.50 | | | | | |
| | Formic acid | 5.00 | | | | | |
| | H.C. polymer 2L *³ | 0.00500 | | | | | |
| | Cupric oxide | 2.20 | | | | | |
| | Surfynol 440 *⁴ | 0.00100 | | | | | |

*²manufactured by Senka Corporation, 47 wt % aqueous solution of quaternary ammonium salt-type polymer, weight average molecular weight of polymer: 200000
*³ manufactured by Osaka Organic Chemical Industry Ltd., 20 wt % aqueous solution of quaternary ammonium salt-type polymer, weight average molecular weight of polymer: 200000
*⁴ manufactured by Nissin Chemical Industry Co., Ltd., nonionic surfactant

TABLE 1-5

| | Blending components | | Amino group-containing compound (A) | | Polymer (B) | Halide ion (C) | | Cupric ion (D) |
|---|---|---|---|---|---|---|---|---|
| | Components | Concentration (% by weight) | Type | Concentration (% by weight) | Concentration (% by weight) | Type | Concentration (% by weight) | Concentration (% by weight) |
| Example 16 | Ammonium chloride | 2.30 | Ammonium ion and Ammonia | 0.9 | 0.00100 | Chloride ion | 1.5 | 1.8 |
| | Ammonia | 0.15 | | | | | | |
| | Formic acid | 5.00 | | | | | | |
| | H.C. polymer 2L *³ | 0.00500 | | | | | | |
| | Cupric oxide | 2.20 | | | | | | |
| | Surfynol 440 *⁴ | 0.00100 | | | | | | |
| Example 17 | Ammonium chloride | 3.04 | Ammonium ion and Ammonia | 1.2 | 0.00100 | Chloride ion | 2.0 | 1.8 |
| | Ammonia | 0.15 | | | | | | |
| | Formic acid | 5.00 | | | | | | |
| | H.C. polymer 2L *³ | 0.00500 | | | | | | |
| | Cupric oxide | 2.20 | | | | | | |
| | Surfynol 440 *⁴ | 0.00100 | | | | | | |
| Example 18 | Ammonium chloride | 2.00 | Ammonium ion and Ammonia | 0.8 | 0.00036 | Chloride ion | 1.3 | 3.6 |
| | Ammonia | 0.10 | | | | | | |
| | Formic acid | 10.00 | | | | | | |
| | H.C. polymer 2L *³ | 0.00180 | | | | | | |

TABLE 1-5-continued

| | | | | | | | | |
|---|---|---|---|---|---|---|---|---|
| | Cupric oxide | 4.50 | | | | | | |
| | Surfynol 440 *4 | 0.00100 | | | | | | |
| Example 19 | Ammonium chloride | 2.00 | Ammonium | 0.8 | 0.00035 | Chloride | 1.3 | 3.9 |
| | Ammonia | 0.10 | ion | | | ion | | |
| | Formic acid | 10.00 | and | | | | | |
| | H.C. polymer 2L *3 | 0.00175 | Ammonia | | | | | |
| | Cupric oxide | 4.85 | | | | | | |
| | Surfynol 440 *4 | 0.00100 | | | | | | |

| | | Blending components | | Concentration ratio | | | Soldering heat | L* |
|---|---|---|---|---|---|---|---|---|
| | Components | Concentration (% by weight) | | A/B | C/B | D/B | resistance | value |
| Example 16 | Ammonium chloride | 2.30 | | 923 | 1527 | 1756 | 3 | 66.2 |
| | Ammonia | 0.15 | | | | | | |
| | Formic acid | 5.00 | | | | | | |
| | H.C. polymer 2L *3 | 0.00500 | | | | | | |
| | Cupric oxide | 2.20 | | | | | | |
| | Surfynol 440 *4 | 0.00100 | | | | | | |
| Example 17 | Ammonium chloride | 3.04 | | 1171 | 2019 | 1756 | 3 | 64.2 |
| | Ammonia | 0.15 | | | | | | |
| | Formic acid | 5.00 | | | | | | |
| | H.C. polymer 2L *3 | 0.00500 | | | | | | |
| | Cupric oxide | 2.20 | | | | | | |
| | Surfynol 440 *4 | 0.00100 | | | | | | |
| Example 18 | Ammonium chloride | 2.00 | | 2144 | 3689 | 9975 | 3 | 70.0 |
| | Ammonia | 0.10 | | | | | | |
| | Formic acid | 10.00 | | | | | | |
| | H.C. polymer 2L *3 | 0.00180 | | | | | | |
| | Cupric oxide | 4.50 | | | | | | |
| | Surfynol 440 *4 | 0.00100 | | | | | | |
| Example 19 | Ammonium chloride | 2.00 | | 2206 | 3794 | 11058 | 2 | 74.2 |
| | Ammonia | 0.10 | | | | | | |
| | Formic acid | 10.00 | | | | | | |
| | H.C. polymer 2L *3 | 0.00175 | | | | | | |
| | Cupric oxide | 4.85 | | | | | | |
| | Surfynol 440 *4 | 0.00100 | | | | | | |

*3 manufactured by Osaka Organic Chemical Industry Ltd., 20 wt % aqueous solution of quaternary ammonium salt-type polymer, weight average molecular weight of polymer: 200000
*4 manufactured by Nissin Chemical Industry Co., Ltd., nonionic surfactant As shown in the results in Tables 1-1 to 1-5, Examples of the present invention were all satisfactory for adhesion evaluation as they were rated "3" or "2" even with a low etching amount of 0.5 On the other hand, Comparative Examples were all rated "1". These results show that according to the present invention, adhesion between copper and a resin can be maintained even with a low etching amount.

When comparing Examples 1 and 2 and Comparative Examples 4 to 7, compounds blended in the microetching solutions of these Examples and Comparative Examples are the same, and only the blending amounts thereof are different. From the fact that Examples 1 and 2 were rated "3" for adhesion evaluation, whereas Comparative Examples 4 to 7 were rated "1" for adhesion evaluation, it is apparent that in the present invention, adhesion between copper and a resin can be maintained even with a low etching amount because the microetching solution contains specific components and the blending ratio thereof falls within a specific range.

<Surface Observation and Cross Section Observation>

Figure 4:
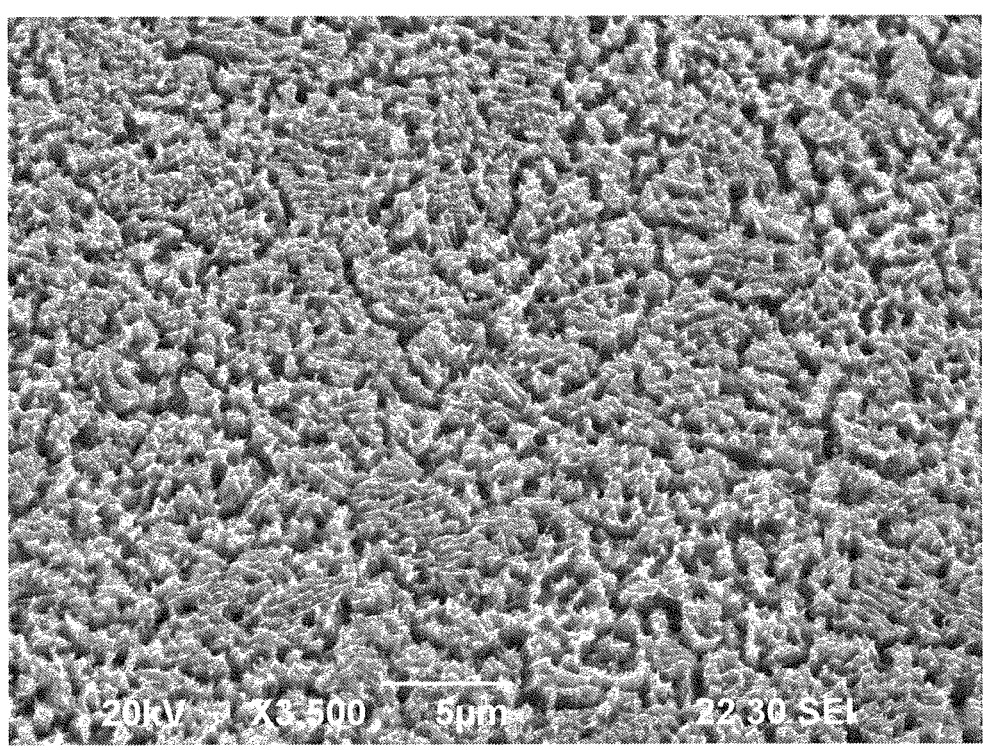
FIG. 4 A scanning electron microscope photograph (photographing angle: 45°, magnification: 3500) of a surface of a copper foil subjected to a roughening treatment with a microetching solution of an example.
Figure 5:
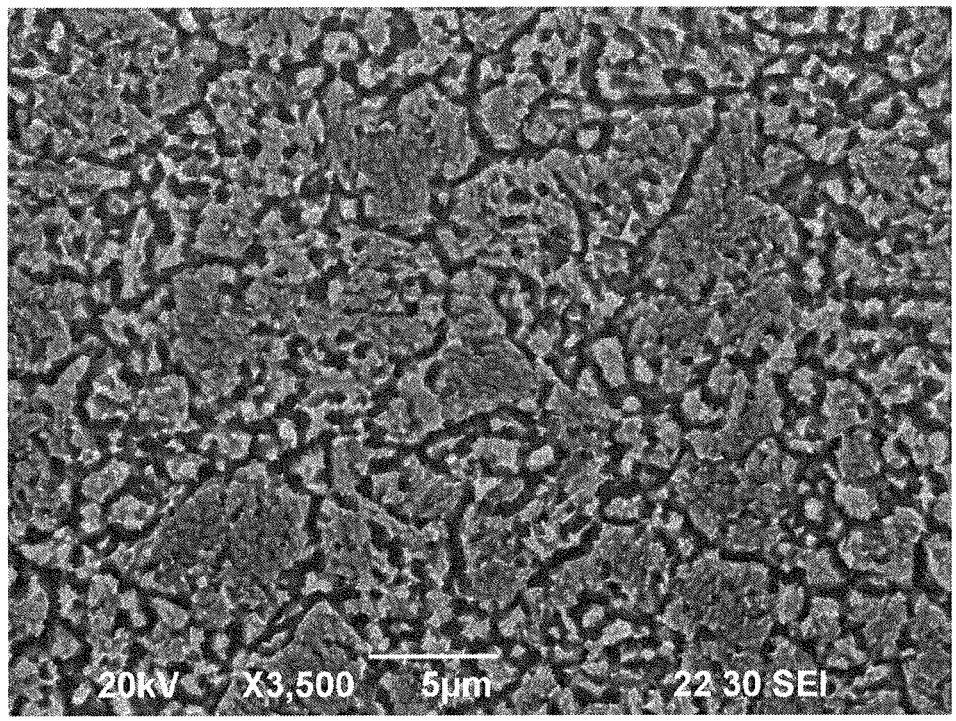
FIG. 5 A scanning electron microscope photograph (photographing angle: straight above, magnification: 3500) of a surface of a copper foil subjected to a roughening treatment with a microetching solution of an example.
Figure 6:
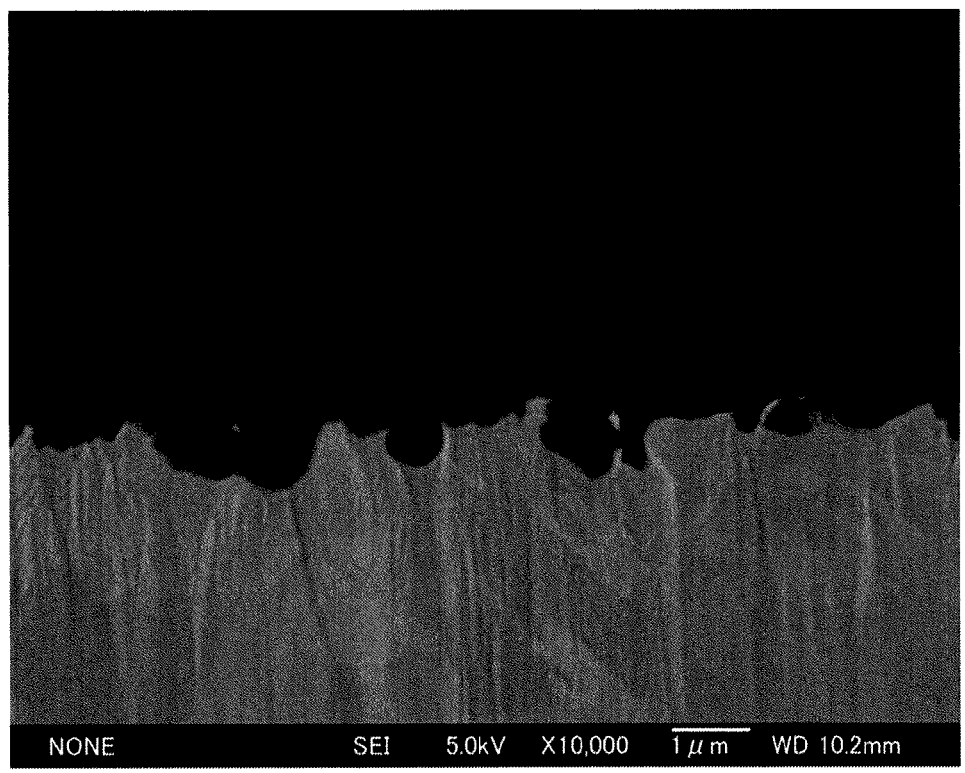
FIG. 6 A scanning electron microscope photograph (magnification: 10000) of a cross-section of a copper foil subjected to a roughening treatment with a microetching solution of an example.
Figure 7:
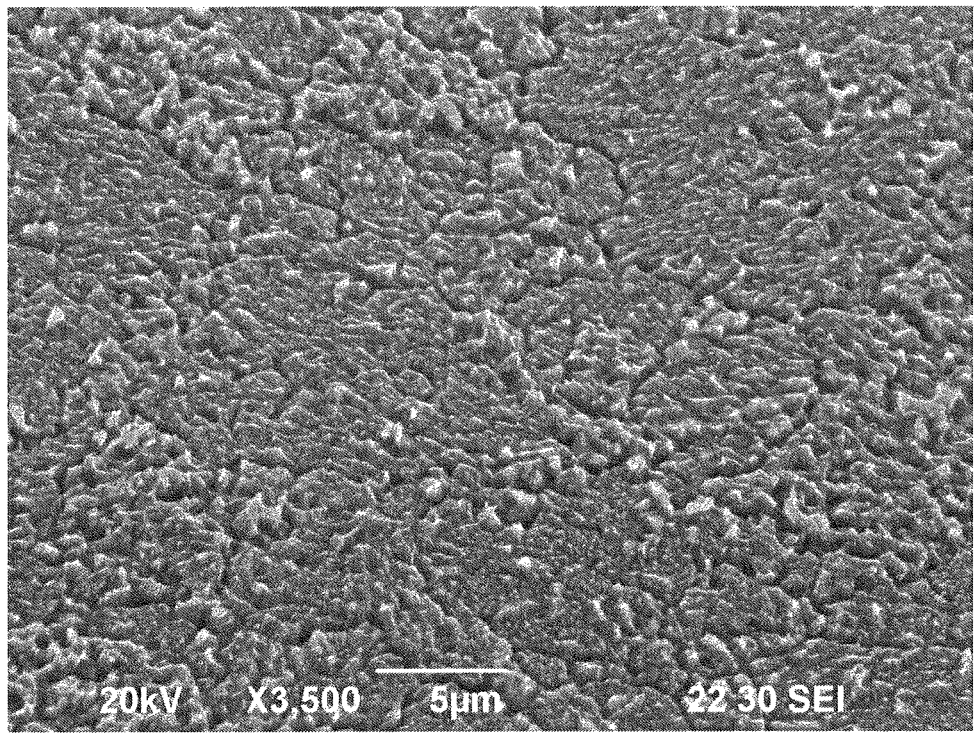
FIG. 7 A scanning electron microscope photograph (photographing angle: 45°, magnification: 3500) of a surface of a copper foil subjected to a roughening treatment with a microetching solution of a comparative example.

An electrolytic copper foil having a thickness of 35 μm was treated under conditions identical to those for the treatment with the microetching solution of Example 1, followed by observing the surface and cross section of the treated copper foil using a scanning electron microscope (SEM) (Model: JSM-7000F, manufactured by JEOL Ltd.). SEM photographs thus obtained are shown in FIGS. 4 to 6. Also an electrolytic copper foil having a thickness of 35 μm was treated under conditions identical to those for the treatment with the microetching solution of Comparative Example 2, and the surface of the copper foil was observed using a scanning electron microscope (SEM) (Model: JSM-7000F, manufactured by JEOL Ltd.). An SEM photograph thus obtained is shown in FIG. 7. From comparison of FIG. 4 and FIG. 7, it is apparent that according to the present invention, fine irregularities can be formed over the entire surface of the copper layer even with a low etching amount. It is considered that according to the present invention, the surface area of the copper layer increases because a large number of fine irregularities are formed over the entire surface, so that high adhesion to a resin or the like is achieved even with a low etching amount.

For comparing in detail the roughened shape obtained using the microetching solution of the present invention and the roughened shape obtained using a microetching solution with the value of A/B falling out of the range of 50 to 6000, observations were made with an SEM according to the procedure shown below.

Figure 8:
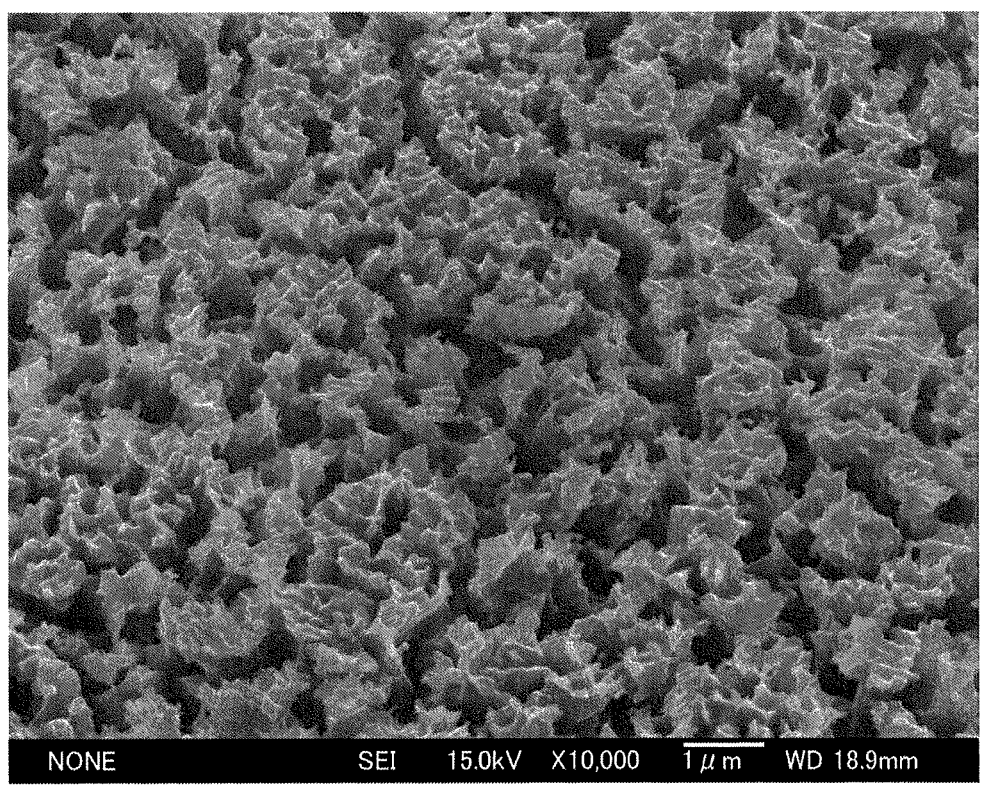
FIG. 8 A scanning electron microscope photograph (photographing angle: 45°, magnification: 10000) of a surface of a copper foil subjected to a roughening treatment with a microetching solution of an example.
Figure 9:
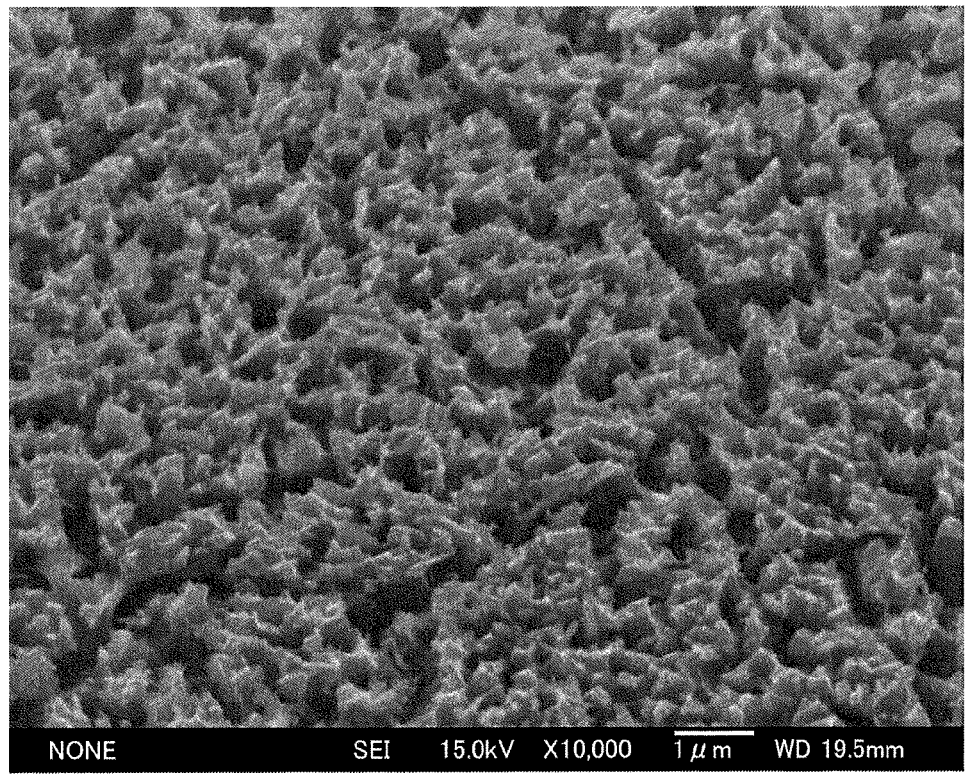
FIG. 9 A scanning electron microscope photograph (photographing angle: 45°, magnification: 10000) of a surface of a copper foil subjected to a roughening treatment with a microetching solution of an example.
Figure 10:
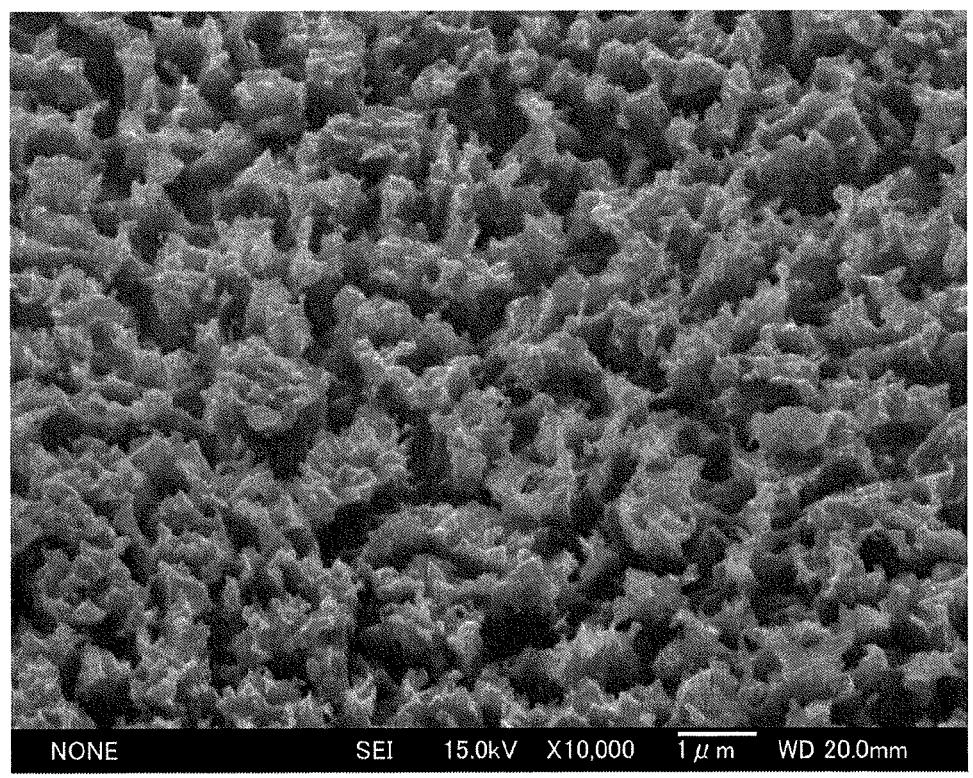
FIG. 10 A scanning electron microscope photograph (photographing angle: 45°, magnification: 10000) of a surface of a copper foil subjected to a roughening treatment with a microetching solution of an example.
Figure 11:
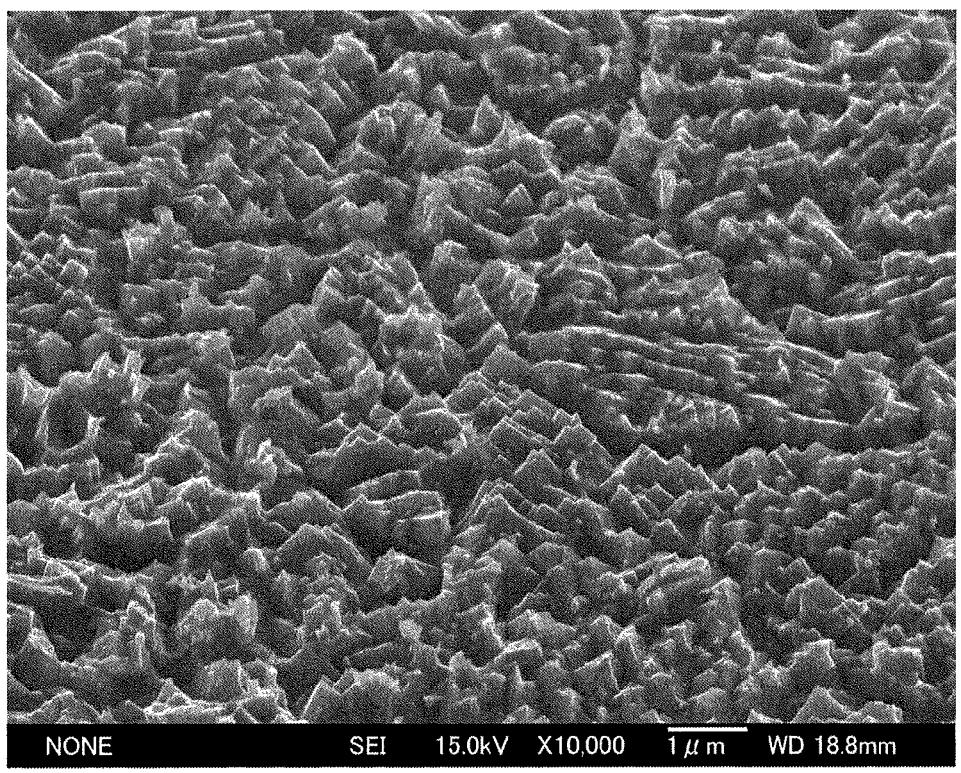
FIG. 11 A scanning electron microscope photograph (photographing angle: 45°, magnification: 10000) of a surface of a copper foil subjected to a roughening treatment with a microetching solution of a comparative example.
Figure 12:
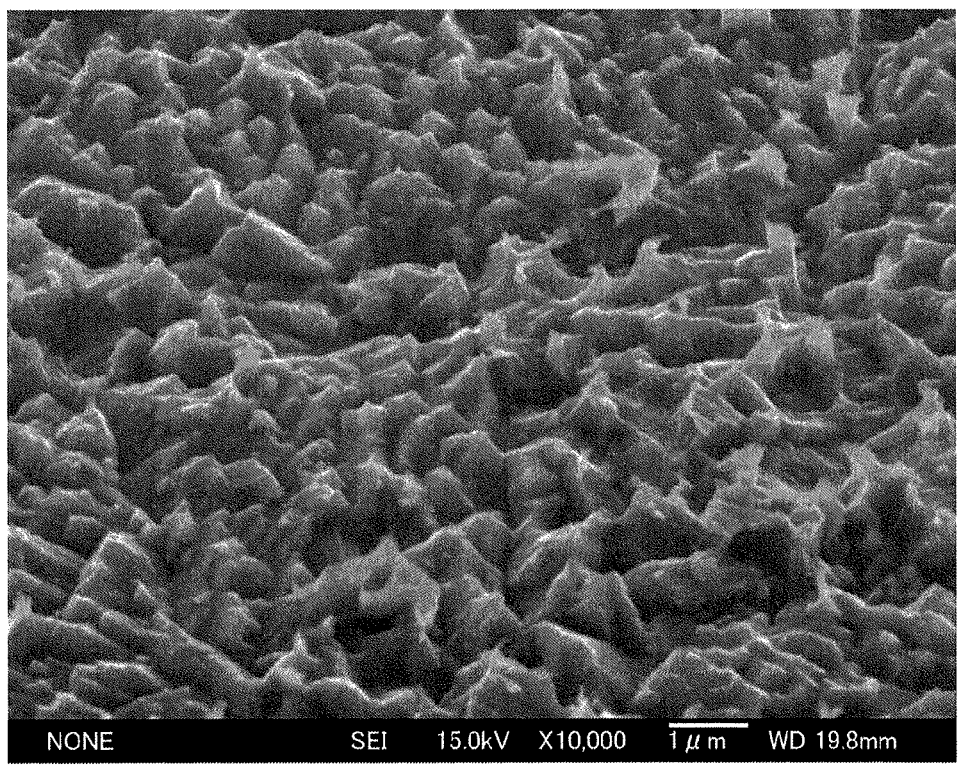
FIG. 12 A scanning electron microscope photograph (photographing angle: 45°, magnification: 10000) of a surface of a copper foil subjected to a roughening treatment with a microetching solution of a comparative example.
Figure 13:
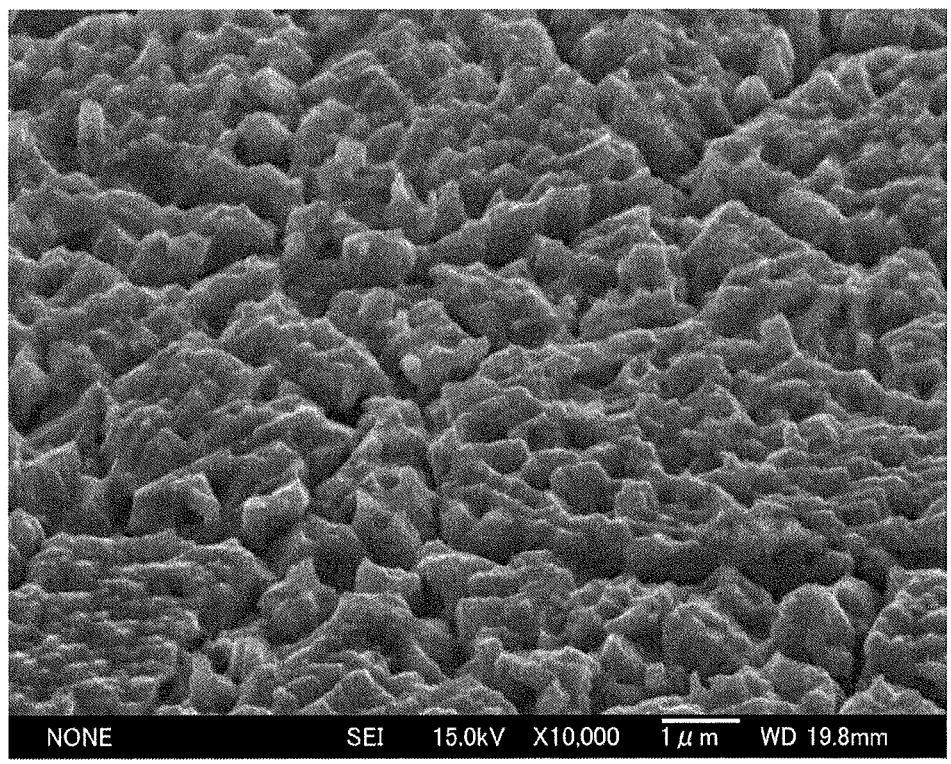
FIG. 13 A scanning electron microscope photograph (photographing angle: 45°, magnification: 10000) of a surface of a copper foil subjected to a roughening treatment with a microetching solution of a comparative example.
Figure 14:
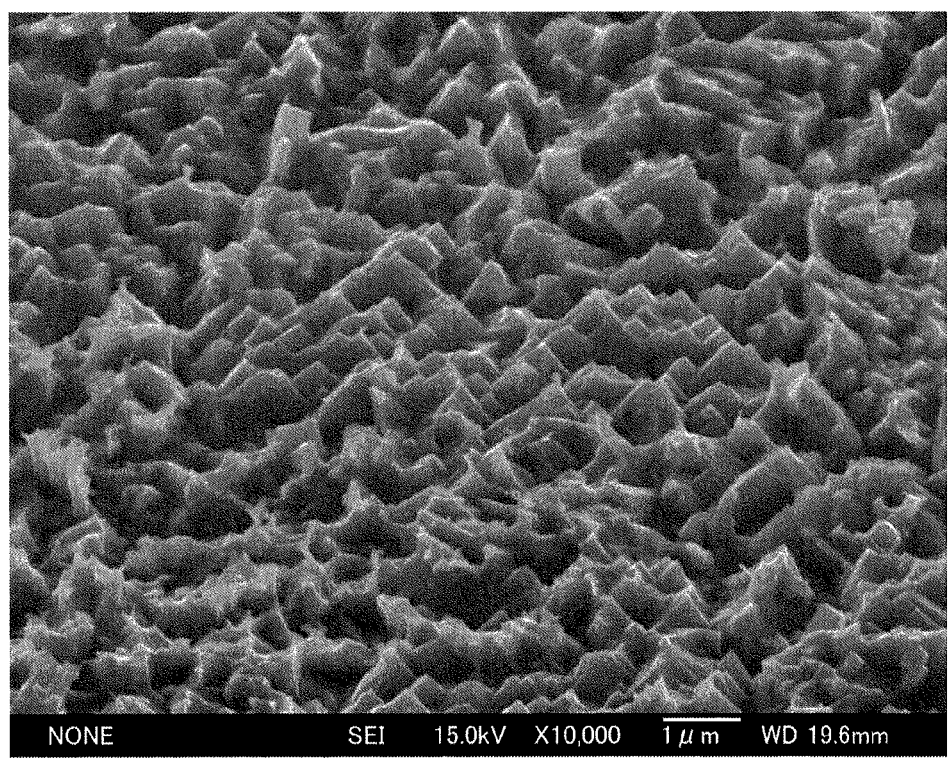
FIG. 14 A scanning electron microscope photograph (photographing angle: 45°, magnification: 10000) of a surface of a copper foil subjected to a roughening treatment with a microetching solution of a comparative example.
Figure 15:
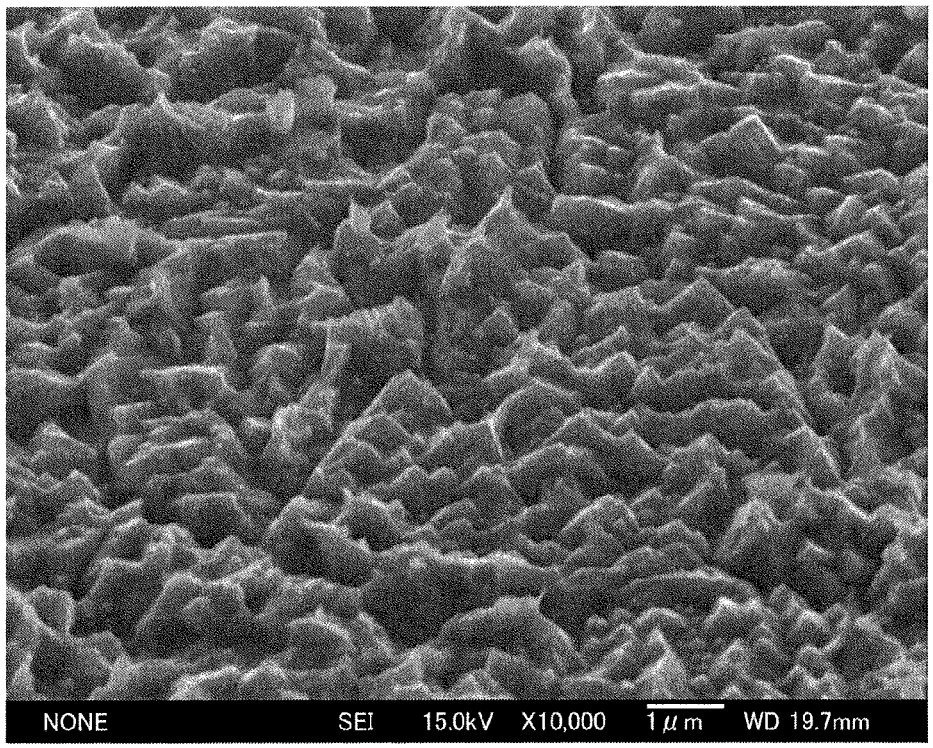
FIG. 15 A scanning electron microscope photograph (photographing angle: 45°, magnification: 10000) of a surface of a copper foil subjected to a roughening treatment with a microetching solution of a comparative example.
Figure 16:
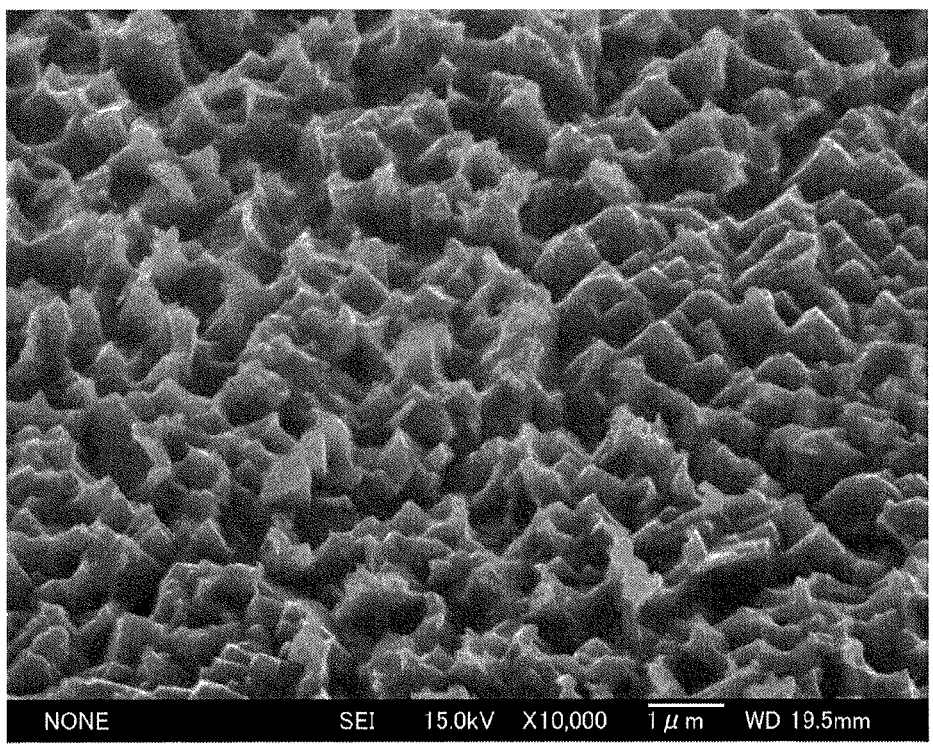
FIG. 16 A scanning electron microscope photograph (photographing angle: 45°, magnification: 10000) of a surface of a copper foil subjected to a roughening treatment with a microetching solution of a comparative example.

Electrolytic copper foils having a thickness of 35 μm were treated under conditions identical to those for the treatments with the microetching solutions of Examples 1, 2 and 7 and Comparative Examples 1, 2 and 4 to 7, respectively, followed by observing the surfaces of the treated copper foils using a scanning electron microscope (SEM) (Model: JSM-7000F, manufactured by JEOL Ltd.). FIG. 8 (Example 1), FIG. 9 (Example 2), FIG. 10 (Example 7), FIG. 11 (Comparative Example 1), FIG. 12 (Comparative Example 2), FIG. 13 (Comparative Example 4), FIG. 14 (Comparative Example 5), FIG. 15 (Comparative Example 6) and FIG. 16 (Comparative Example 7) show SEM photographs (photographing angle: 45°, magnification: 10000) taken at the time of SEM observation.

From comparison of Example 1 (FIG. 8) and Example 7 (FIG. 10) with Comparative Example 1 (FIG. 11), Comparative Example 2 (FIG. 12) and Comparative Example 5 (FIG. 14), it is apparent that different roughened shapes are formed at values larger than and smaller than 6000, the upper limit of A/B defined in the present invention. From comparison of Example 2 FIG. 9) with Comparative Example 4 (FIG. 13), Comparative Example 6 (FIG. 15 and Comparative Example 7 (FIG. 16), it is apparent that different roughened shapes are formed at values larger than and smaller than 50, the lower limit of A/B defined in the present invention. That is, in Examples 1 and 7 with a value of A/B smaller than the upper limit, finer roughened shapes were obtained as compared to Comparative Examples 1, 2 and 5 with a value of A/B larger than the upper limit, and in Example 2 with a value of A/B larger than the lower limit, a finer roughened shape was obtained as compared to Comparative Examples 4, 6 and 7 with a value of A/B smaller than the lower limit. The roughened shapes of Comparative Examples 1, 2 and 5 and Comparative Examples 4, 6 and 7 are such that cone-shaped projections having a smooth surface lie in a row, whereas the roughened shapes of Examples 1 and 7 and Example 2 are such that fine irregular shapes and protrusions are further formed on the surfaces of projections. Thus, it is considered that in Examples, satisfactory adhesion was achieved even with a low etching amount because a unique roughened shape is formed on the copper layer surface when the microetching solution of the present invention is used.

<Evaluation of Adhesion to Solder Resist>

One surface of an electrolytic copper foil having a thickness of 35 μm was sprayed with the microetching solution (25° C.) of each of Example 1 and Comparative Example 1 at a spray pressure of 0.05 MPa, and etching was performed with the etching time adjusted so that the etching amount at the electrolytic copper foil surface became the value shown in Table 2 below. Then, the copper foil was washed with water, and the etching-treated surface was clipped in hydrochloric acid at a temperature of 25° C. (hydrogen chloride concentration: 3.5% by weight) for 10 seconds, and then washed with water and dried. A photosensitive liquid solder resist (manufactured by Hitachi Chemical Company, Ltd., trade name: SR-7300G) was applied in a thickness of 20 μm to the etching-treated surface of each copper foil after drying, and cured. Then, as a backing pad, a copper-clad laminated sheet (manufactured by Hitachi Chemical Company, Ltd., trade name: MCL-E-67) was bonded to the solder resist layer surface by a double sided tape, followed by cutting only the electrolytic copper foil part in a line shape having a width of 1 cm. Thereafter, the peel strength (N/mm) between the copper foil cut in a line shape and the solder resist layer was measured according to JIS C 6481. The results are shown in Table 2.

TABLE 2

|  | Microetching solution | Etching amount (μm) | Peel strength (N/mm) |
|---|---|---|---|
| Test Example 1 | Example 1 | 0.5 | 0.753 |
| Test Example 2 |  | 0.6 | 0.807 |
| Test Example 3 |  | 0.7 | 1.005 |
| Test Example 4 |  | 1.0 | 1.014 |
| Test Example 5 |  | 1.3 | 1.019 |
| Test Example 6 |  | 1.4 | 1.012 |
| Test Example 7 |  | 1.5 | 1.015 |
| Test Example 8 | Comparative | 0.5 | 0.469 |
| Test Example 9 | Example 1 | 0.6 | 0.512 |
| Test Example 10 |  | 0.7 | 0.551 |
| Test Example 11 |  | 1.0 | 0.649 |
| Test Example 12 |  | 1.3 | 0.793 |
| Test Example 13 |  | 1.4 | 0.943 |
| Test Example 14 |  | 1.5 | 1.003 |

When the microetching solution of Example 1 was used (Test Examples 1 to 7), the peel strength reached 1.0 N/mm in the Test Example 3 where the etching amount was 0.7 μm. On the other hand, when the microetching solution of Comparative Example 1 was used (Test Examples 8 to 14), an etching amount of 1.5 μm was necessary for achieving a peel strength of 1.0 N/mm (Test Example 14), and it is thus apparent that in Example 1, a comparable peel strength can be achieved in an etching amount smaller than that in Comparative Example 1. This result is considered to be ascribable to a difference between the roughened shape obtained by the microetching solution of Example 1 and the roughened shape obtained by the microetching solution of Comparative Example 1. That is, as described above, it is considered that according to the microetching solution of Example 1, a unique fine roughened shape different from that in Comparative Example 1 is obtained, so that adhesion between copper and a resin can be secured even with a low etching amount.

<Comparison of Wiring Shapes>

Figure 17:
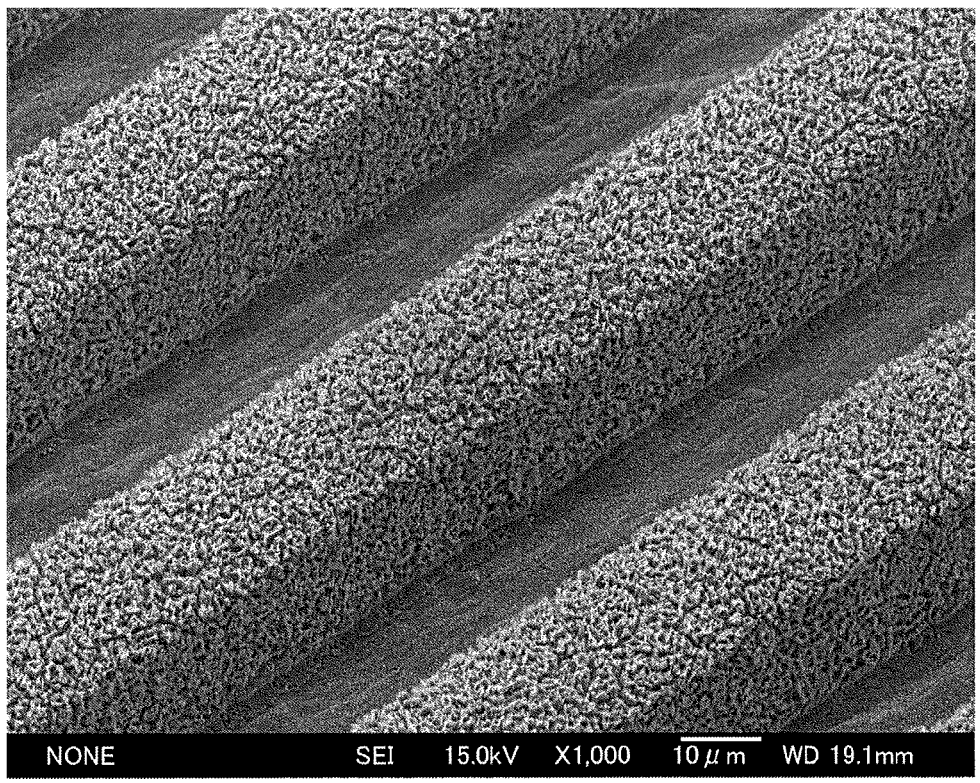
FIG. 17 A scanning electron microscope photograph (photographing angle: 45°, magnification: 1000) of a surface of a copper wiring pattern subjected to a roughening treatment with a microetching solution of an example.

A wiring board having a copper wiring pattern with a line/space (L/S) of 25 μm/25 μm and a height of 20 μm was provided as a test board. The copper wiring pattern of the test board was sprayed with the microetching solution (25° C.) of each of Example 1 and Comparative Example 1 at a spray pressure of 0.05 MPa, and etching was performed with the etching time adjusted so as to have an etching amount with which a peel strength of 1.0 N/mm was achieved in the <Evaluation of Adhesion to Solder Resist>. That is, the etching amount was 0.7 μm for Example 1, and the etching amount was 1.5 μm for Comparative Example 1. Then, the test board was washed with water, and the etching-treated surface was dipped in hydrochloric acid at a temperature of 25° C. (hydrogen chloride concentration: 3.5% by weight) for 10 seconds, and then washed with water and dried. The copper wiring pattern after treatment was observed using a scanning electron microscope (SEM) (Model: JSM-7000F, manufactured by JEOL Ltd.). FIG. 17 (Example 1) and FIG. 18 (Comparative Example 1) show SEM photographs (photographing angle: 45°, magnification: 1000) taken at the time of SEM observation.

Figure 18:
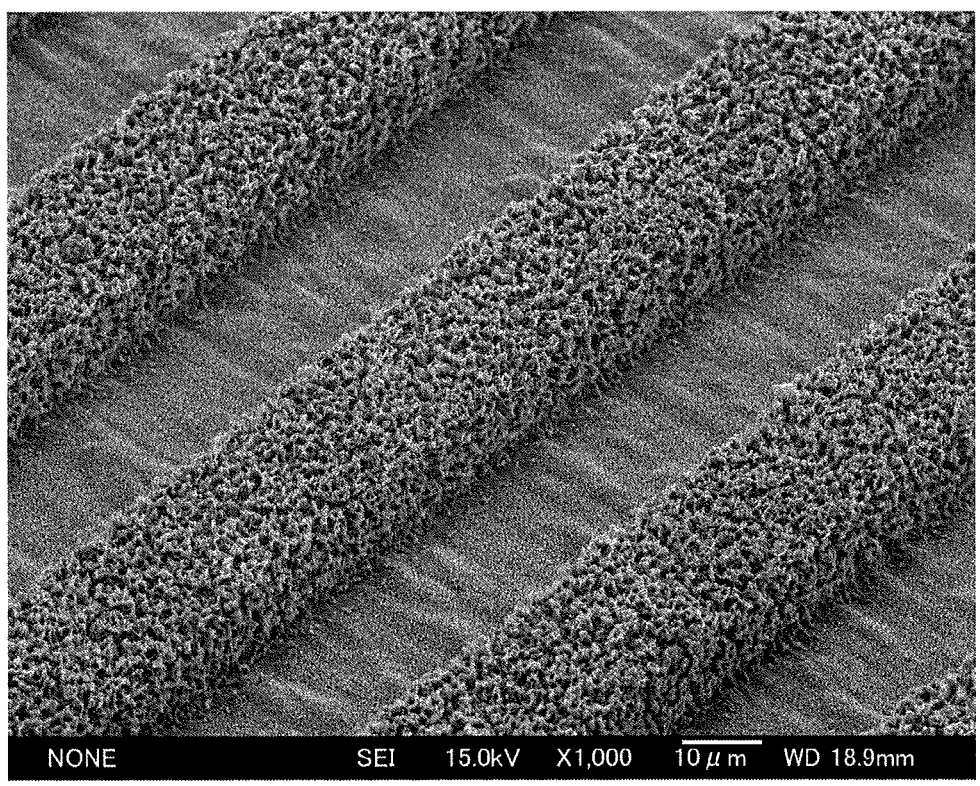
FIG. 18 A scanning electron microscope photograph (photographing angle: 45°, magnification: 1000) of a surface of a copper wiring pattern subjected to a roughening treatment with a microetching solution of a comparative example.

When comparing FIG. 17 and FIG. 18, it is apparent that when the microetching solution of Comparative Example 1 is used, for achieving a peel strength comparable to that in Example 1, both the width and height of copper wiring must be made smaller as compared to Example 1, leading to decrease in cross-sectional area of wiring. From this result, it is apparent that according to the present invention, adhesion to a resin can be maintained without significantly decreasing the cross-sectional area of wiring, so that an increase in resistance of copper wiring can be suppressed. Further, the present invention may be useful particularly in production of a printed wiring board of fine wiring which has a narrow wiring pitch (line/space) because problems such as breakage hardly occur even when copper wiring is made to undergo further pitch narrowing (wiring miniaturization).

The invention claimed is:

1. A microetching solution for copper, wherein the microetching solution is an aqueous solution containing: a cupric ion; an organic acid; a halide ion; an amino group-containing compound having a molecular weight of 17 to 400; and a polymer, wherein
   the polymer is a water-soluble polymer including a polyamine chain and/or a cationic group and having a weight average molecular weight of 1000 or more, and
   where a concentration of the amino group-containing compound is A % by weight and a concentration of the polymer is B % by weight, and a value of A/B is 50 or more to 6000 or less.

2. The microetching solution according to claim 1, wherein where a concentration of the halide ion is C % by weight and the concentration of the polymer is B % by weight, and a value of C/B is 1500 or more to 15000 or less.

3. The microetching solution according to claim 1, wherein where a concentration of the cupric ion is D % by weight and the concentration of the polymer is B % by weight, and a value of D/B is 1500 or more to 10000 or less.

4. The microetching solution according to claim 1, wherein the concentration of the polymer is 0.0001 to 0.01% by weight.

5. The microetching solution according to claim 1, wherein the amino group-containing compound is at least one selected from ammonia, ammonium ion and ethylenediamine.

6. The microetching solution according to claim 1, wherein the polymer is at least one selected from a quaternary ammonium salt-type polymer, polyethyleneimine and polyalkylene polyamine.

7. A method for production of a wiring board including a copper layer, the method comprising:
   roughening treatment step of bringing a microetching solution into contact with a surface of a copper layer to roughen the surface, wherein
   the microetching solution is an aqueous solution containing: a cupric ion; an organic acid; a halide ion; an amino group-containing compound having a molecular weight of 17 to 400; and a polymer,
   the polymer is a water-soluble polymer including a polyamine chain and/or a cationic group and having a weight average molecular weight of 1000 or more, and
   where a concentration of the amino group-containing compound is A % by weight and a concentration of the polymer is B % by weight, and a value of A/B is 50 or more to 6000 or less.

8. The method for production of a wiring board according to claim 7, wherein an L* value of the surface of the copper layer after being brought into contact with the microetching solution is 70 or less.

9. The method for production of a wiring board according to claim 7, wherein an average etching amount in a depth direction at a time of roughening the surface of the copper layer is 0.05 to 1.0 μm.

10. The method for production of a wiring board according to claim 7, wherein the roughened surface of the copper layer is washed with an acidic aqueous solution after the roughening treatment step.

11. The method for production of a wiring board according to claim 7, wherein
   the roughening treatment step is step of roughening the surface of the copper layer while adding a replenishment solution to the microetching solution, wherein the replenishment solution is an aqueous solution containing: an organic acid; a halide ion; an amino group-containing compound having a molecular weight of 17 to 400; and a polymer, and
   the polymer contained in the replenishment solution is a water-soluble polymer including a polyamine chain and/or a cationic group and having a weight average molecular weight of 1000 or more.

* * * * *